(12) United States Patent
Bhat

(10) Patent No.: US 11,798,643 B1
(45) Date of Patent: Oct. 24, 2023

(54) NON-VOLATILE STORAGE SYSTEM WITH HYBRID SLC WEAR LEVELING

(71) Applicant: Western Digital Technologies, Inc., San Jose, CA (US)

(72) Inventor: Vinayak Bhat, Bengaluru (IN)

(73) Assignee: Western Digital Technologies, Inc., San Jose, CA (US)

( * ) Notice: Subject to any disclaimer, the term of this patent is extended or adjusted under 35 U.S.C. 154(b) by 121 days.

(21) Appl. No.: 17/695,518

(22) Filed: Mar. 15, 2022

(51) Int. Cl.
| | |
|---|---|
| *G11C 16/10* | (2006.01) |
| *G11C 16/34* | (2006.01) |
| *G11C 16/14* | (2006.01) |
| *G11C 16/04* | (2006.01) |
| *G06F 3/06* | (2006.01) |
| *G11C 11/56* | (2006.01) |
| *H01L 25/065* | (2023.01) |
| *H10B 43/27* | (2023.01) |

(52) U.S. Cl.
CPC .......... *G11C 16/349* (2013.01); *G06F 3/0616* (2013.01); *G06F 3/0652* (2013.01); *G06F 3/0679* (2013.01); *G11C 11/5671* (2013.01); *G11C 16/0483* (2013.01); *G11C 16/14* (2013.01); *G11C 16/344* (2013.01); *G11C 16/3445* (2013.01); *G11C 16/10* (2013.01); *H01L 25/0657* (2013.01); *H01L 2225/06562* (2013.01); *H10B 43/27* (2023.02)

(58) Field of Classification Search
CPC ................................................... G11C 16/10
See application file for complete search history.

(56) References Cited

U.S. PATENT DOCUMENTS

| | | | |
|---|---|---|---|
| 8,667,215 B2 | 3/2014 | Marotta et al. | |
| 8,825,941 B2 | 9/2014 | Moshayedi et al. | |
| 9,176,862 B2 | 11/2015 | Chen et al. | |
| 10,325,668 B2 | 6/2019 | Muccherla et al. | |
| 11,188,261 B2 | 11/2021 | Papandreou et al. | |
| 2011/0107016 A1 | 5/2011 | Kim et al. | |
| 2019/0121725 A1* | 4/2019 | Sehgal | G11C 16/10 |

FOREIGN PATENT DOCUMENTS

EP 2291746 B1 10/2014

* cited by examiner

*Primary Examiner* — Jason Lappas
(74) *Attorney, Agent, or Firm* — Vierra Magen Marcus LLP

(57) ABSTRACT

Technology is disclosed herein for reducing wear due to erasing and programming non-volatile memory cells. The memory system selects a hybrid SLC group of cells for programming to an SLC mode while the selected hybrid SLC group is presently programmed to either the SLC mode or an MLC mode. Memory cells in the selected hybrid SLC group are erased to an SLC erased state regardless of the presently programmed mode of the selected hybrid SLC group. An average memory cell Vt of the SLC erased state is greater than an average threshold voltage of an MLC erased state. Memory cells in the selected hybrid SLC group are programmed from the SLC erased state to an SLC programmed state. Erasing the hybrid SLC group to the SLC erased state reduces wear relative to erasing to the MLC erased state. Therefore, the useful life of the hybrid SLC group is extended.

20 Claims, 17 Drawing Sheets

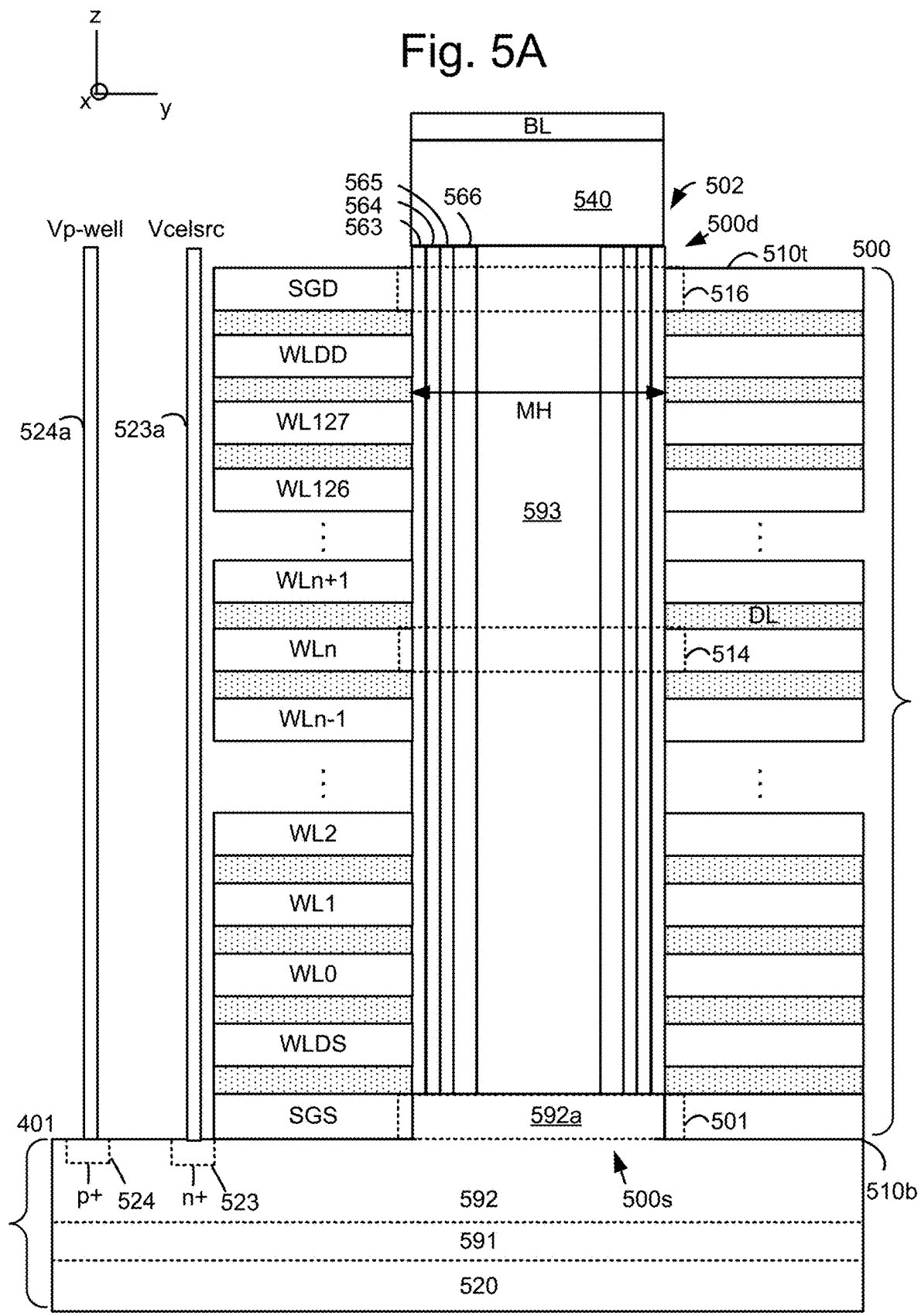

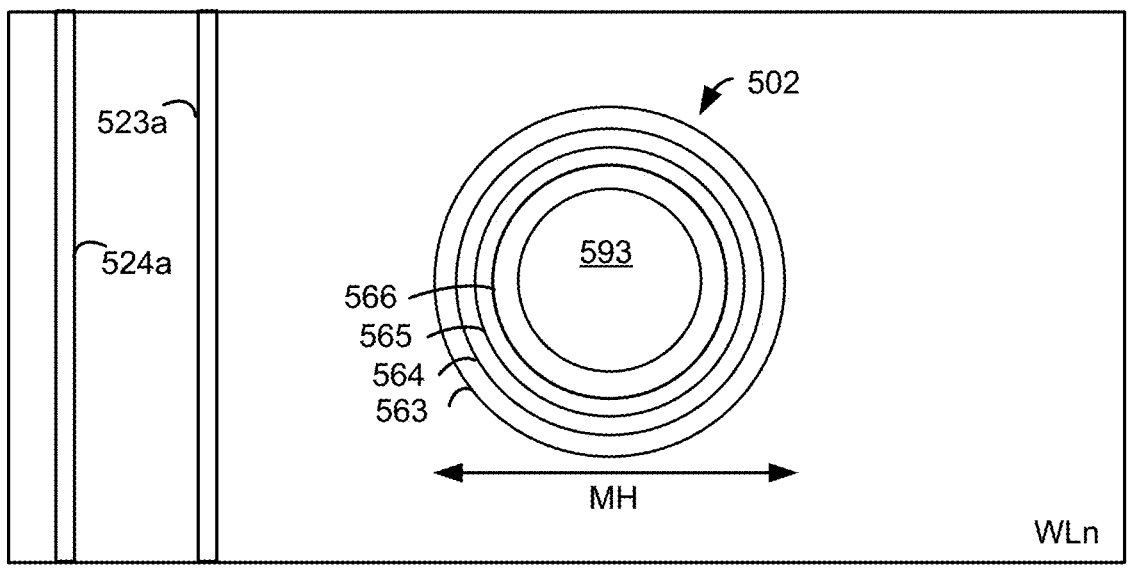

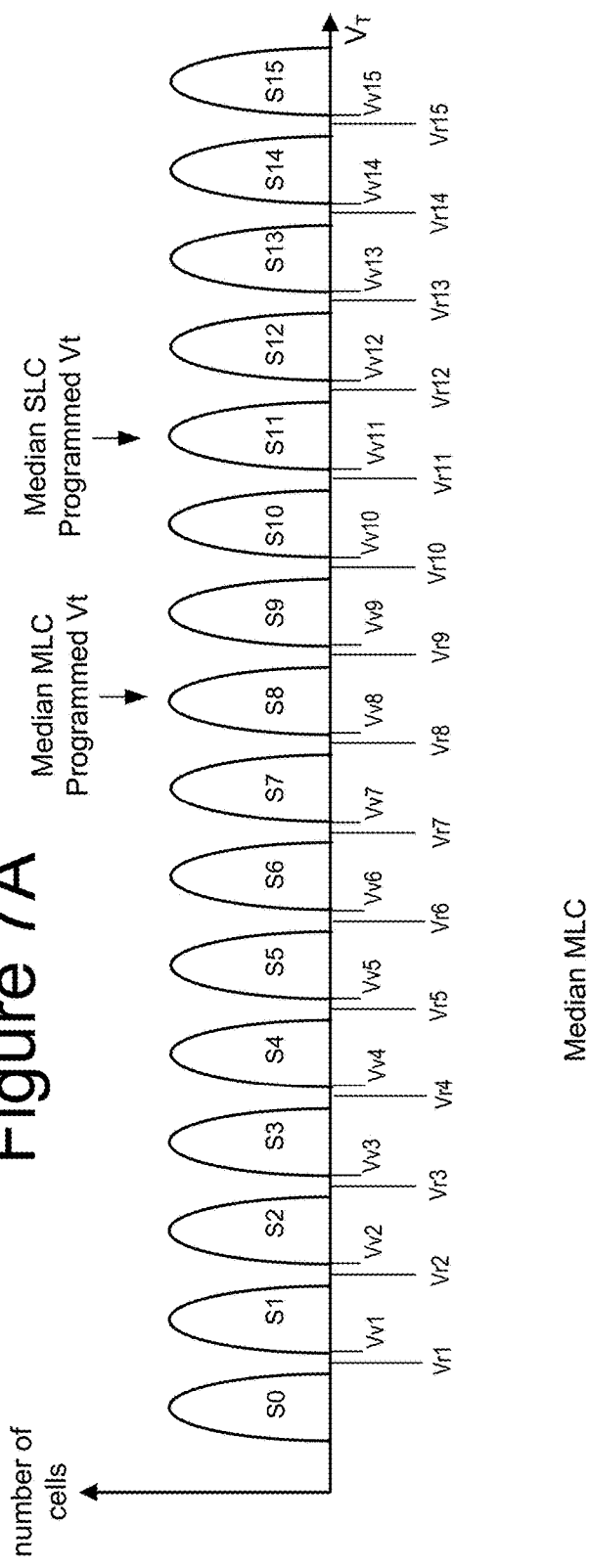
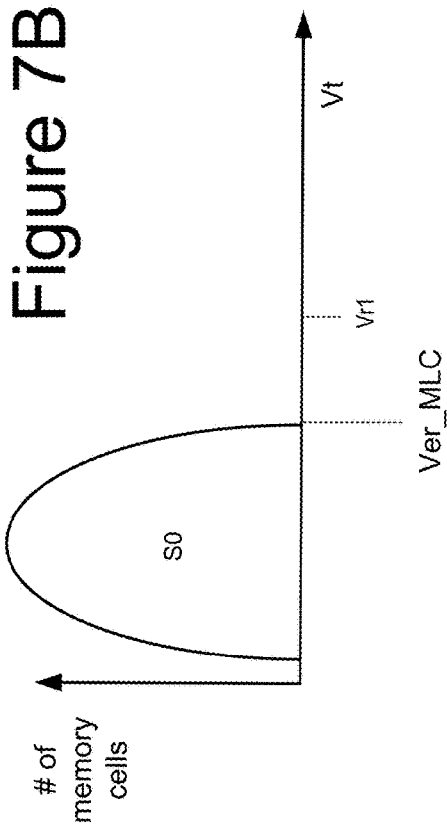

NON-VOLATILE STORAGE SYSTEM WITH HYBRID SLC WEAR LEVELING

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

Some memory cells, such as NAND memory cells, contain a memory cell transistor having a charge storage region. The threshold voltage (Vt) of the memory cell transistor is a function of the amount of change stored in the charge storage region. The memory cell may be programmed by adding charge to the charge storage region, thereby increasing the Vt. The memory cell may be erased by removing charge from the charge storage region, thereby decreasing the Vt. The memory cell transistor also has a tunnel oxide (or gate oxide) adjacent to the transistor's channel. Programming and erasing the memory cell results in electrons passing through the tunnel oxide.

Data can be stored in the memory cells by programming the cells to different data states which may be represented by different ranges of Vts. The data states may include an erased state and one or more programmed states. In some techniques, all memory cells in a group are erased to an erase Vt distribution. Herein, the term "erase block" will be used to refer to a group of memory cells that are erased as a unit. An erase verify process may be used to compare the Vts of the memory cells to an erase verify reference voltage. The memory cells are then programmed to one or more programmed states, with each programmed state being represented by a different range of Vts. The amount of wear that memory cells experience is related to the number of program/erase cycles.

In a single bit per cell mode, also referred to as a single level cell (SLC) mode, one bit of data is stored in each memory cell. In a multiple bits per cell mode, also referred to as a multi-level cell (MLC) mode, multiple bits of data are stored in each memory cell. The SLC mode provides higher speed programming while the MLC mode provides higher density data storage. The memory system may designate certain groups of memory cells for use in the SLC mode and other groups for use in the MLC mode. Some groups of memory cells can transition between the SLC mode and the MLC mode. Herein, a group of memory cells that is designated for use as either the SLC mode or an MLC mode is referred to as a hybrid SLC group.

BRIEF DESCRIPTION OF THE DRAWINGS

Like-numbered elements refer to common components in the different figures.

FIG. 5A depicts an example cross-sectional view of a portion of the block 406 of FIG. 4A.

FIG. 5B depicts an example cross-sectional view of the block portion of FIG. 5A in the x-y plane at the level of WLn.

FIG. 7A shows 16 threshold voltage distributions, corresponding to 16 data states for an MLC mode.

FIG. 7B shows an erase threshold voltage distributions for an MLC mode.

DETAILED DESCRIPTION

Figure 1:
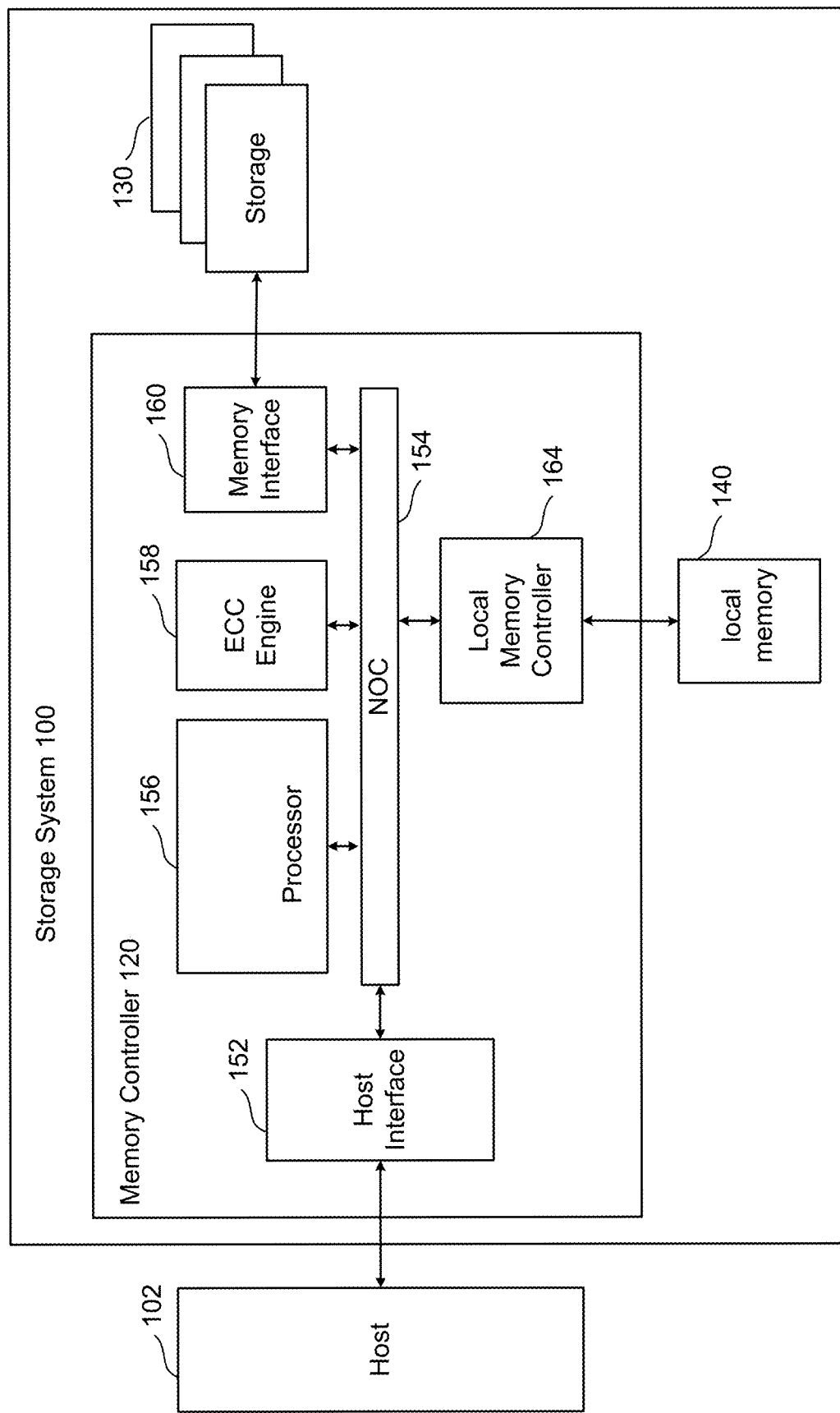
FIG. 1 is a block diagram depicting one embodiment of a storage system.

Technology is disclosed herein for operating a memory system that designates some groups (e.g., erase blocks) of memory cells for hybrid SLC usage. Techniques are disclosed for reducing wear due to erasing and programming the hybrid SLC groups. Each hybrid SLC group is eligible to be programmed to different programming modes that include a SLC mode and an MLC mode. The memory system selects a hybrid SLC group for programming to the SLC mode while the selected hybrid SLC group is presently programmed to either the SLC mode or an MLC mode. The memory system erases memory cells in the selected hybrid SLC group to an erased state associated with the SLC mode regardless of the presently programmed mode of the selected hybrid SLC group. An average (e.g., median, mean) memory cell Vt of the erased state associated with the SLC mode is greater than an average threshold voltage of an erased state associated with the MLC mode. The memory system programs selected memory cells in the selected hybrid SLC group from the erased state associated with the SLC mode to a programmed state associated with the SLC mode.

The amount of wear that memory cells experience due to erasing and programming is related to the Vt swing that a memory cell experiences due to erase and program. The Vt swing may impact the number of electrons (or holes) that tunnel through a tunnel oxide of a memory cell transistor, which may result in trap generation and/or charge trapping. In some embodiments, erasing hybrid SLC groups to the SLC mode erased state reduces the average Vt swing during erase of hybrid SLC groups in order to reduce wear. In some embodiments, the erase verify voltage used when erasing memory cells to the MLC erased state is lower than the erase verify voltage used when erasing memory cells to the SLC erased state. Therefore, hybrid SLC memory cells may experience greater wear when erased to the MLC erased state associated than when erased to the SCL erased state.

However, the erase verify reference voltage for the SLC erased state may be greater than at least one program verify reference voltage associated with the MLC mode. Therefore, if a group of memory cells were to be erased to the SLC erased state, they could not be correctly programmed to the programmed states of the MLC mode. In some conventional techniques, hybrid SLC memory cells are always erased to the MLC erased state to allow for the possibility to program the cells to the programmed states of the MLC mode. However, by selecting a hybrid SLC group for programming to the SLC mode while the selected hybrid SLC group is presently programmed (regardless of whether programmed to the SLC mode or the MLC mode), the hybrid SLC group can be erased to the SLC erased state thereby reducing wear. Erasing the hybrid SLC group to the SLC erased state reduces wear relative to erasing the hybrid SLC group to the MLC mode erased state. Therefore, the useful life of the hybrid SLC group is extended.

In an embodiment, the memory system selects hybrid SLC blocks for erase and program based on a prospective wear metric. The prospective wear metric may be based on how much wear the hybrid SLC block would experience if erased and programmed. The memory system maintains a past wear metric for each hybrid SLC block. The past wear metric is based on actual program/erase cycles. For both the past wear metric and the prospective wear metric a greater (higher) value corresponds to more wear. The memory system assigns a prospective wear metric to each candidate hybrid SLC block based at least in part on a prospective erase wear. In an embodiment, the memory system assigns a higher prospective wear metric to candidate hybrid SLC blocks presently programmed to SLC threshold voltage distributions than candidate hybrid blocks presently programmed to MLC threshold voltage distributions. The memory system adds the prospective wear metric to the past wear metric for each candidate hybrid SLC block to determine a prospective total wear metric for each candidate hybrid SLC block. The memory system selects the candidate hybrid SLC block having the lowest prospective total wear metric for erasing and programming. Thus, it is possible that a first hybrid SLC block having a higher past wear metric is selected over a second hybrid SLC block having a lower past wear metric if the first hybrid SLC block has a lower prospective wear metric. The foregoing achieves wear leveling goals while also reducing wear on the hybrid SLC blocks. Thus, the useful life of hybrid SLC blocks is extended.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

The memory controller 120 may also maintain tables in local memory 140 that designate a first set of erase blocks in the storage 130 as SLC blocks, a second set of erase blocks in the storage 130 as MLC blocks, and a third set of erase blocks in the storage 130 as hybrid SLC blocks. Each hybrid SLC block is eligible to be programmed to different program modes that include an SLC mode and an MLC mode. The memory controller 120 may select hybrid SLC blocks for erase and program in a manner that reduces wear. In some embodiments, the selection is based on a Vt swing that memory cells in the hybrid SLC blocks will experience if erased and/or programmed. Reducing the Vt swing reduces wear.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
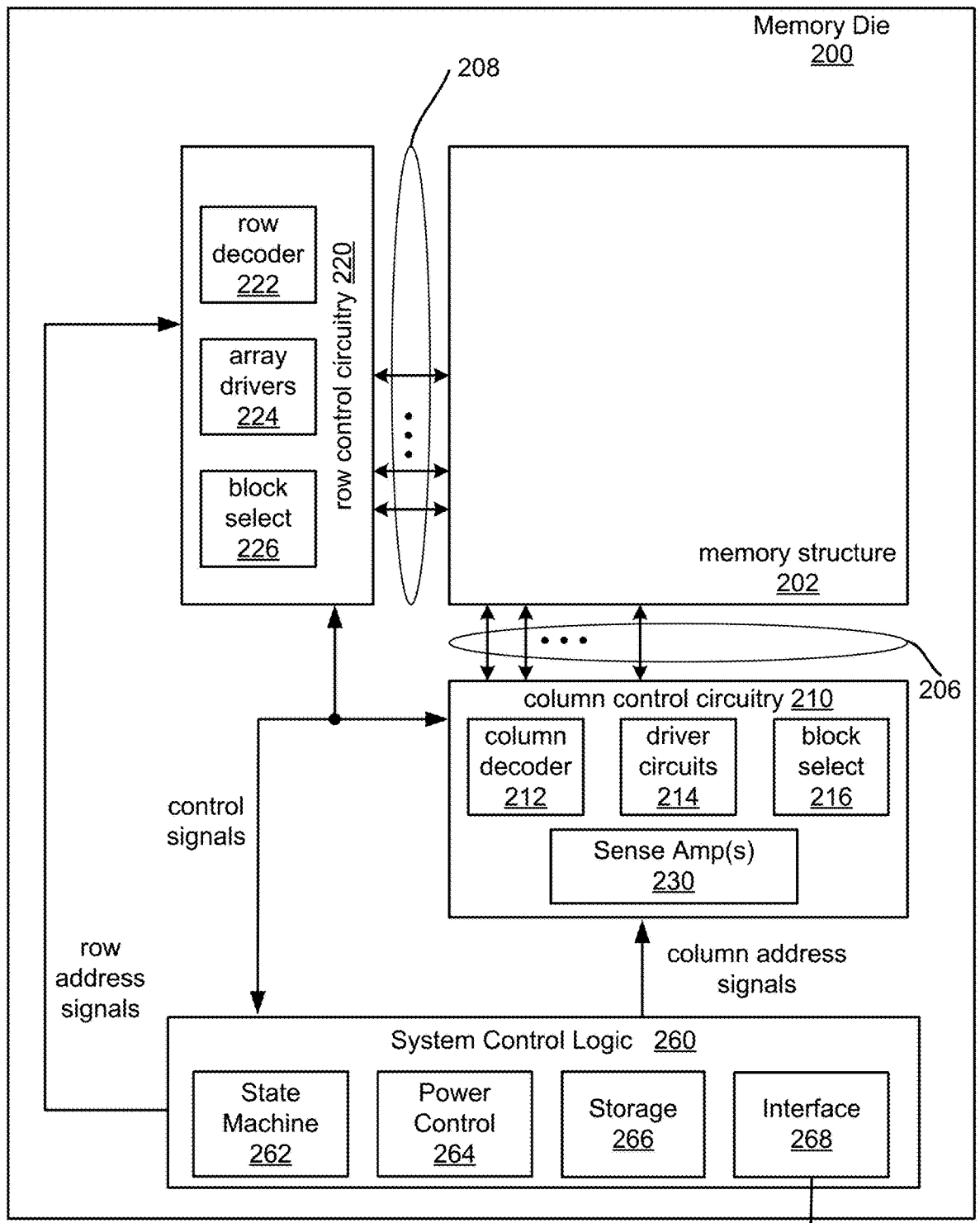
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the dies to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two dies can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
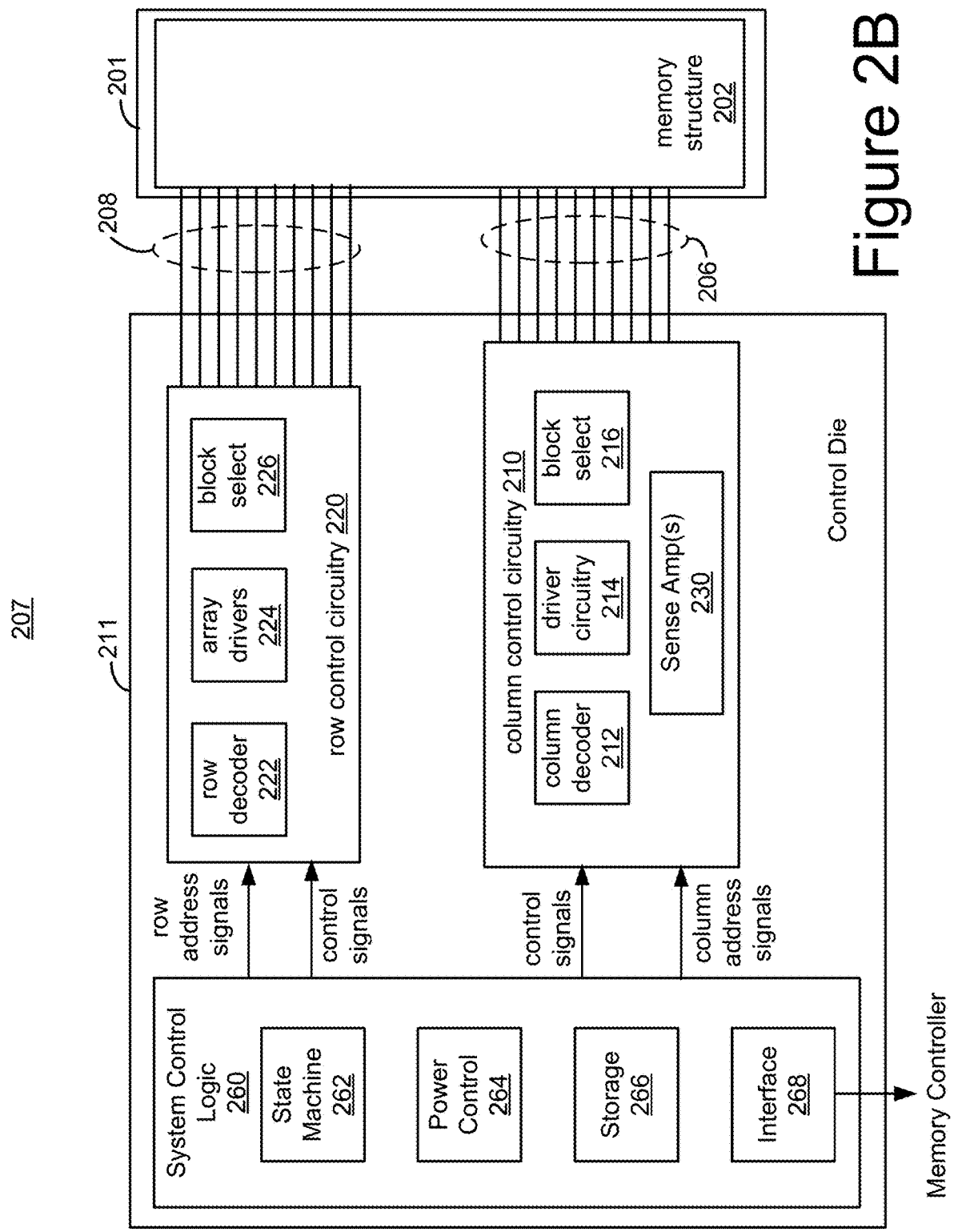
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense amps 230, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
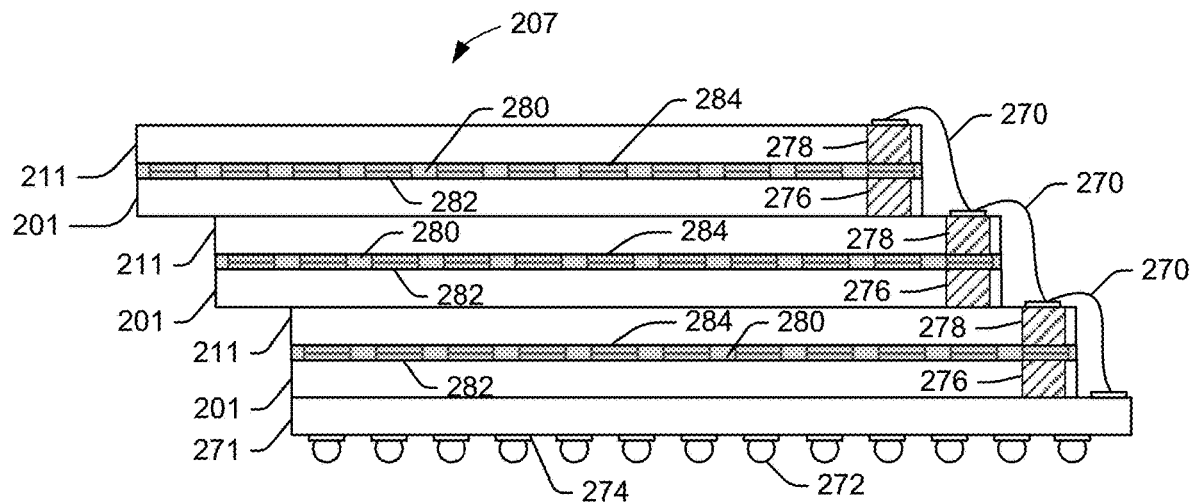
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory dies 201. In some embodiments, there are more than three memory dies 201 and more than three control dies 211.

Each control die 211 is affixed (e.g., bonded) to at least one of the memory die 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor die 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
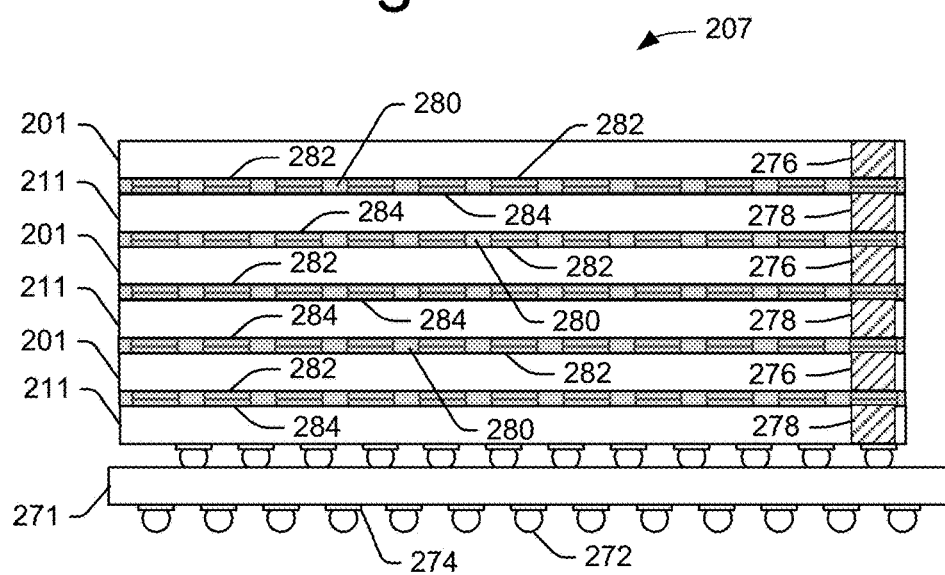

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are more than three memory structure dies 201 and more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two die 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material, but in embodiments, it may be Hysol epoxy resin from Henkel Corp., having offices in California, USA.

Figure 4A:
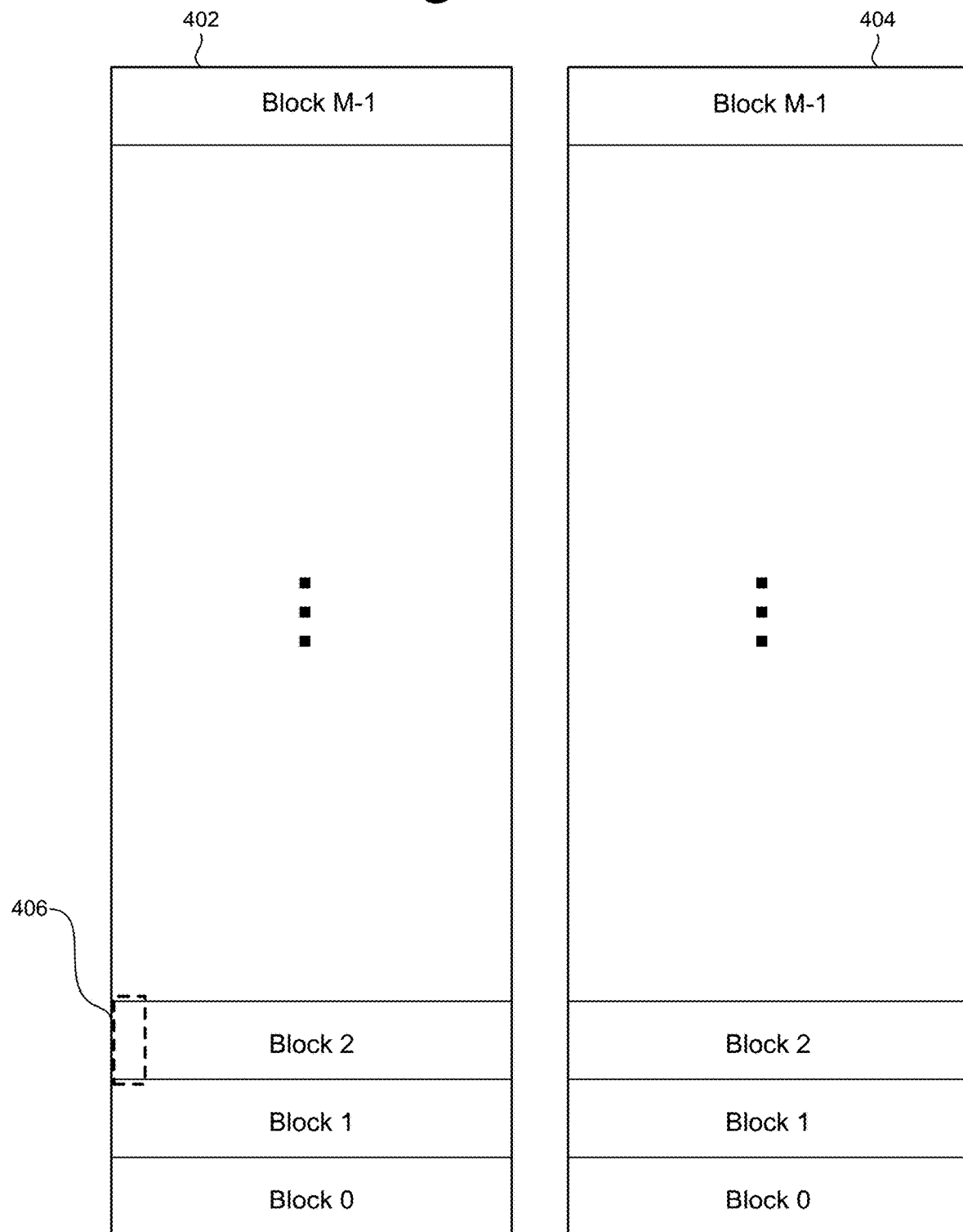
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. A sub-block that is a unit of erase is an example of an erase block. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or fewer than two planes can be implemented. In some embodiments, memory structure 202 includes four planes. In some embodiments, memory structure 202 includes eight planes. In some embodiments, programming can be performed in parallel in a first selected block in plane 402 and a second selected block in plane 404.

Figure 4B:
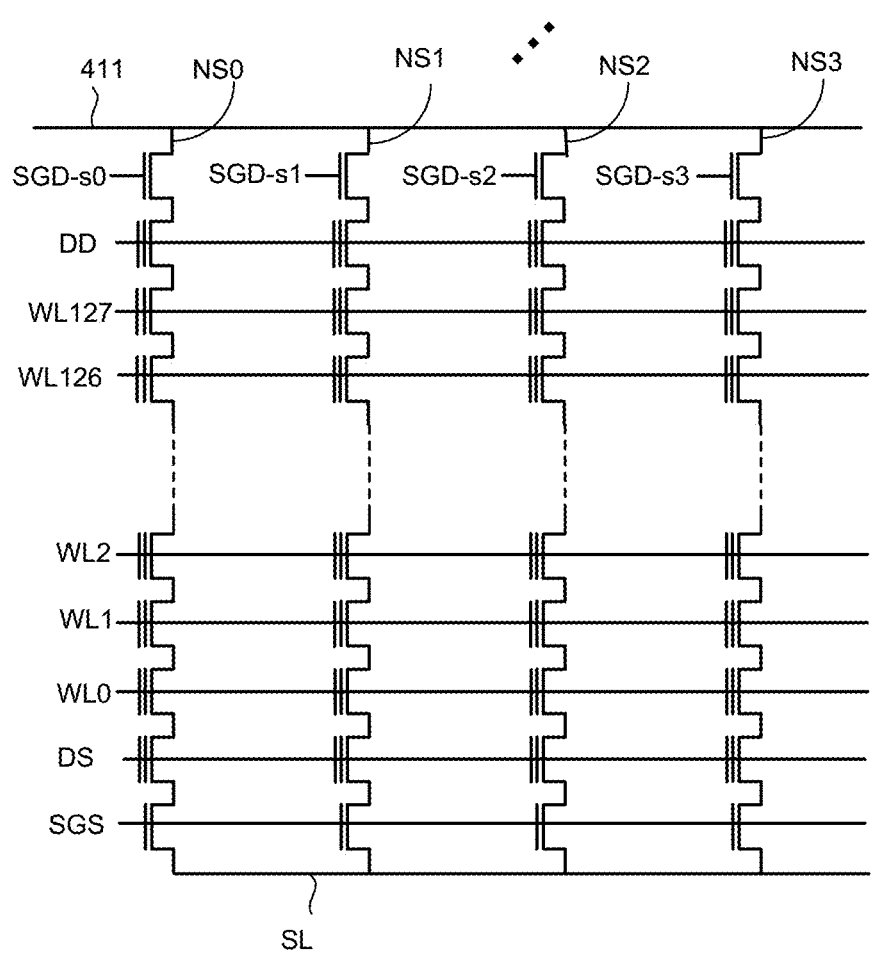
FIG. 4B is a schematic of a plurality of NAND strings in multiple sub-blocks of a same block.

FIG. 4B is a schematic diagram of a portion of the memory structure 202. FIG. 4B shows physical data word lines WL0-WL127 running across the entire block. There is also a source side dummy word line (DS) and a drain side dummy word line (DD), which do not store user data. Also depicted is a source side selected line (SGS) and a several drain side selected lines (SGD-s0, SGD-s1, SGD-s2, SGD-s3). The structure of FIG. 4B corresponds to a portion 406 in Block 2 of FIG. 4A, including bit line 411. Within the block, in one embodiment, each bit line is connected to four NAND strings. Thus, FIG. 4B shows bit line connected to NAND string NS0, NAND string NS1, NAND string NS2, and NAND string NS3.

In one embodiment, there are four drain side select lines in the block (SGD-s0, SGD-s1, SGD-s2, and SGD-s3). Each respective drain side select line can be selected independent of the others. Each drain side select line connects to a group of NAND strings in the block. Only one NAND string of each group is depicted in FIG. 4B. These four drain side select lines correspond to four sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. As noted, FIG. 4B only shows the NAND strings connected to bit line 411. However, a full schematic of the block would show every bit line and four vertical NAND strings connected to each bit line.

In some embodiments, the block is divided into an upper tier and a lower tier, each of which contains half the word lines. For example, the lower tier may contain WL0-WL63 and the upper tier may contain WL64-WL127. In some embodiments, the upper tier and lower tier may be erased independently. Thus, the upper tier may contain one or more erase blocks and the lower tier may contain one or more erase blocks. In some embodiments, the block is divided into three or more tiers, each of which contains a subset of the word lines. Each of these three or more tiers may contain one or more erase blocks.

FIG. 5A depicts an example cross-sectional view of a portion of the block 406 of FIG. 4A, including a NAND string 502. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, WLn-1, WLn, WLn+1, WL126, WL127, WLDD and SGD. WLn denotes a selected word line for a read or program operation. The dielectric layers are shown by a dotted pattern and include an example dielectric layer DL. The conductive layers extend in a memory hole MH (see also FIG. 5B). The memory holes can have a varying width.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL127, WLDD and SGD(0), in addition to 128 data word lines in this example, although the number of data word lines could be greater or less than 128.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL127 are data word lines connected to data memory cells, which are eligible to store user data.

A top 510$t$ and bottom 510$b$ of the stack are depicted. WL127 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592$a$ which extends upward adjacent to the SGS layer. The p-well region can include an n+ contact 523 connected to a local interconnect 523$a$ (a conductive path or source line) for receiving Vcelsrc, and a p+ contact 524 connected to a conductive path 524$a$ for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 502 has a source end 500$s$ at a bottom 510$b$ of the stack 500, connected to the p-well. The NAND string 502 also has a drain end 500$d$ at a top 510$t$ of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the channels of the NAND string are charged up, such as by applying a positive erase pulse to the substrate, causing the electrons to return to the channel from the charge trapping layer. Damage may occur to the memory cell during both erase and program. The amount of damage is related to the amount of change that crosses the tunneling layer. In some embodiments, the amount of charge that crosses the tunneling layer during erase is reduced by erasing the memory cells to an SLC erased state rather than an MLC erased state thereby reducing damage to the cells.

FIG. 5B depicts an example cross-sectional view of the block portion of FIG. 5A in the x-y plane at the level of WLn. The layers of the NAND string 502 are depicted, including the blocking oxide layer 563, charge-trapping layer 564, tunneling layer 565 and the channel layer 566. The dielectric core 593 is also depicted.

Although the example memories of FIGS. 4B, 5A, 5B are three dimensional memory structure that includes vertical NAND strings, other (2D and 3D) memory structures can also be used with the technology described herein.

Figure 6A:
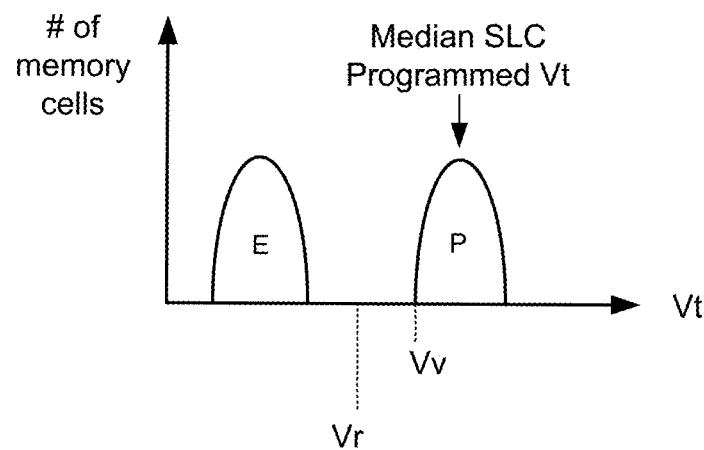
FIG. 6A is a graph of threshold voltage versus number of memory cells, and illustrates example threshold voltage distributions for erase blocks in which each memory cell stores one bit of data per memory cell.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 6A is a graph of threshold voltage versus number of memory cells, and illustrates example threshold voltage distributions for the erase blocks when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 6A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In some techniques approximately half of the memory cells are programmed to the programmed state P. In other words, half of the memory cells are in the erased state and half are in the programmed state. In one embodiment, erased memory cells store data "1" and programmed memory cells store data "0." FIG. 6A depicts read reference voltage Vr. By testing (e.g., performing one or more sense operations) whether the threshold voltage of a given memory cell is above or below Vr, the system can determine a memory cells is erased (state E) or programmed (state P). FIG. 6A also depicts verify reference voltage Vv. In some embodiments, when programming memory cells to data state P, the system will test whether those memory cells have a threshold voltage greater than or equal to Vv.

Figure 6B:
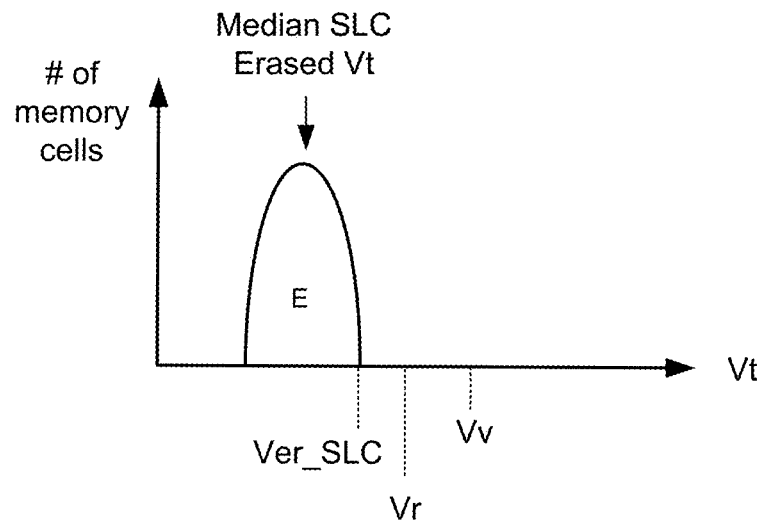
FIG. 6B depicts the erase Vt distribution when the memory cells are erased for the SLC mode.

FIG. 6A shows two Vt distributions when memory cells are programmed in the SLC mode. FIG. 6B depicts the erase Vt distribution when the memory cells are erased for the SLC mode. The erase process includes an erase verify step in which the Vts of the memory cells are tested with respect to the erase verify voltage Ver_SLC. The memory cells will experience stress or wear due to erasing and programming. The median SLC programmed Vt may be about 4.25V and the median SLC erased Vt may be about 0V. The median SLC programmed Vt refers to the median Vt of memory cells in the SLC programmed state P. The median SLC erased Vt refers to the median Vt of memory cells in the SLC erased state E just after erase (FIG. 6B). The amount of wear of a cell is related to the Vt shift of that cell during erase and/or program. During erase, the programmed state cells will experience a significant reduction in Vt. In an embodiment, the Vt reduction is due to removal of electrons from the charge-trapping layer 564 (see FIGS. 5A-5B). The wear can include trap generation and/or charge trapping in the tunneling layer 565.

FIG. 7A shows 16 Vt distributions, corresponding to 16 data states for an MLC mode. The first Vt distribution (erased data state) S0 represents memory cells that are erased. The other 15 Vt distributions (programmed data states) S1-S15 represent memory cells that are programmed and, therefore, are also called programmed states. Each Vt distribution (data state) corresponds to predetermined values for the set of data bits. The specific relationship between the data programmed into the memory cell and the Vt levels of the cell depends upon the data encoding scheme adopted for the cells. In one embodiment, data values are assigned to the Vt ranges using a Gray code assignment so that if the Vt of a memory erroneously shifts to its neighboring physical state, only one bit will be affected. In a three bit per cell MLC example, there will be an erased data state and seven programmed data states. In a two bit per cell MLC example, there will be an erased data state and three programmed data states.

FIG. 7A shows 16 read reference voltages, Vr1-Vr15 for reading data from memory cells. By testing (e.g., performing sense operations) whether the Vt of a given memory cell is above or below the 16 read reference voltages, the system can determine what data state (i.e., S0, S1, S2, . . . ) a memory cell is in. FIG. 7A also shows a number of verify reference voltages. The verify high voltages are Vv1-Vv15. In some embodiments, when programming memory cells to data state S1, the system will test whether those memory cells have a Vt greater than or equal to Vv1. If the memory cell has a Vt greater than or equal to Vv1, then the memory cell is locked out from further programming. Similar reasoning applies to the other data states.

In an embodiment that utilizes full sequence programming, memory cells can be programmed from the erased data state S0 directly to any of the programmed data states S0-S15 using the process of FIG. 8 (discussed below). For example, a population of memory cells to be programmed may first be erased so that all memory cells in the population are in erased data state S0, as depicted in FIG. 7B. Then, a programming process is used to program memory cells directly into programmed data states S1-S15. In some embodiments, data states S0-S15 can overlap, with control die 211 and/or memory controller 120 relying on error correction to identify the correct data being stored. Note that in some embodiments, rather than using full sequence programming, the system can use multi-pass programming processes known in the art.

With respect to FIG. 7B, the erase process includes an erase verify step in which the Vts of the memory cells are tested with respect to the erase verify voltage Ver_MLC. The memory cells will experience stress or wear due to erasing and programming. The median MLC programmed Vt may be about 3.25V and the median MLC erased Vt may be about 1.5V. The median MLC programmed Vt refers to the median Vt of memory cells in the MLC programmed states (S1-S15 in this four bit per cell example). The median MLC erased Vt refers to the median Vt of memory cells in the MLC erased state S0 just after erase (FIG. 7B). Note that this median Vt shift is greater than the example median SLC Vt shift of 4.25V discussed above. Thus, memory cells erased from the MLC programmed states to the MLC erased state may, on average, suffer greater wear than memory cells erased from the SLC programmed state to the SLC erased state. Similar reasoning applies during programming of the respective memory cells. That is, memory cells programmed from the MLC erased state to the MLC programmed states may, on average, suffer greater wear than memory cells programmed from the SLC erased state to the SLC programmed state.

In some embodiments, the median SLC programmed Vt is greater than the median MLC programmed Vt. In the example in FIG. 7A, the median MLC programmed Vt is roughly at about the S8 programmed data state. An example of a median SLC programmed Vt is depicted at roughly about the S11 programmed data state for comparison purposes. Thus, if a group of memory cells were to be erased from the SLC programmed state to the MLC erased state, they may suffer more wear than a group of memory cells erased from the MLC programmed state to the MLC erased state.

Figure 8:
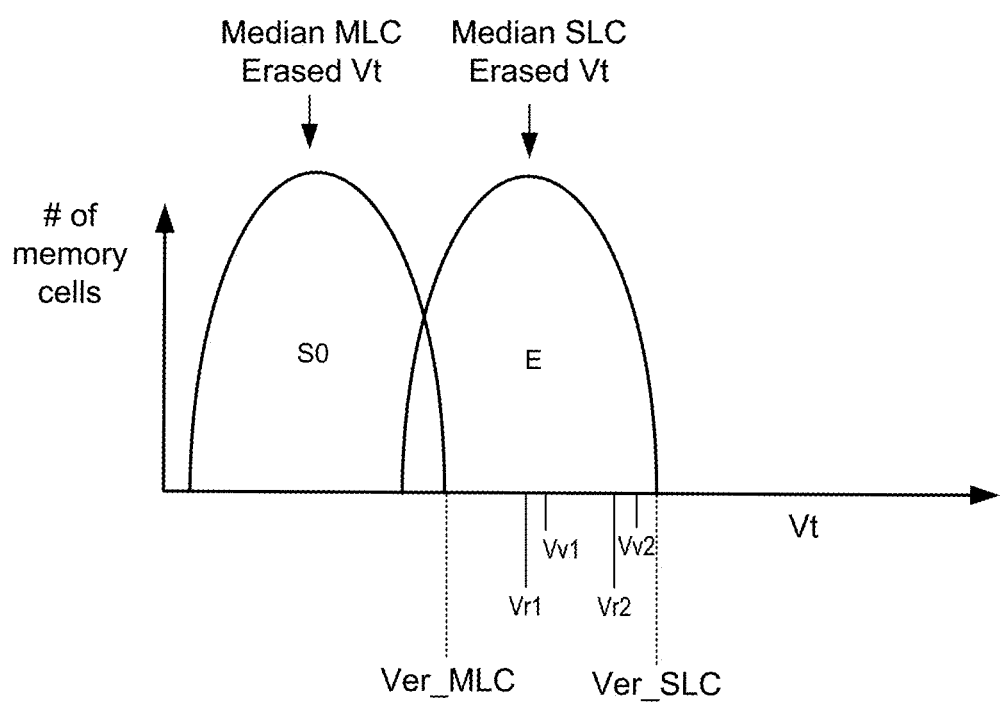
FIG. 8 depicts an example MLC erase Vt distribution and an example SLC erase Vt distribution for comparison.

FIG. 8 depicts an example MLC erase Vt distribution S0 and an example SLC erase Vt distribution E for comparison. The SLC erase verify voltage Ver_SLC is greater than the MLC erase verify voltage Ver_MLC, in this example. The median SLC erase Vt is greater than the median MLC erase Vt in this example. As one example, the median SLC erase Vt is about 1.5V greater than the median MLC erase Vt. Therefore, if memory cells that are in the SLC programmed state P are erased to the MLC erase Vt distribution S0 they will, on average, have a greater Vt shift than if erased to the SLC erase Vt distribution E. Therefore, if memory cells that are in the SLC programmed state P are erased to the MLC erase Vt distribution S0 they may experience greater wear than if erased to the SLC erase Vt distribution E.

FIG. 8 also shows that the SLC erase verify voltage Ver_SLC is greater than at least one of the MLC program verify voltages (e.g., Vv1, Vv2), in this example. Also, the SLC erase verify voltage Ver_SLC is greater than at least one of the MLC read voltages (e.g., Vr1, Vr2), in this example. Thus, if memory cells were to be erased to the SLC erase Vt distribution E they could not properly be programmed to the MLC programmed states. For proper MLC programming, some of the memory cells should remain in the erased state. For a memory cell to be read in the erased state S0, its Vt should be below Vr1. One possible solution to this problem is to always erase hybrid SLC blocks to an MLC erase distribution. However, this will place greater stress on the memory cells than if erasing to the SLC erased state E. In one embodiment, the memory system selects a hybrid SLC block for programming to the SLC mode while the selected hybrid block is presently programmed. The hybrid SLC block could be in either the SLC Vt distribution P or the MLC Vt distributions (e.g., S1-S15). The memory system then erases the selected hybrid SLC block to the SLC erased state E regardless of the present program mode of the selected hybrid SLC block. This reduces wear on the hybrid SLC block relative to erasing the hybrid SLC block to the MLC erased state S0.

FIGS. 6A-8 discussed examples in which the MLC mode is four bits per cell. However, the MLC mode could be two bits per cell, three bits per cell, or some other number of bits per cell. In some embodiments, a hybrid SLC block is eligible for the SLC mode and one MLC mode, such as a four-bit per cell mode. In some embodiments, a hybrid SLC block is eligible for the SLC mode and more than one MLC mode, such as a three-bit per cell mode and a four-bit per cell mode.

FIGS. 6A-8 discussed examples of median programmed and erased Vts; however, the programmed and erased Vts can be characterized in other mathematical terms. For example, programmed and erased Vts could be calculated based on a mathematical mean.

Figure 9:
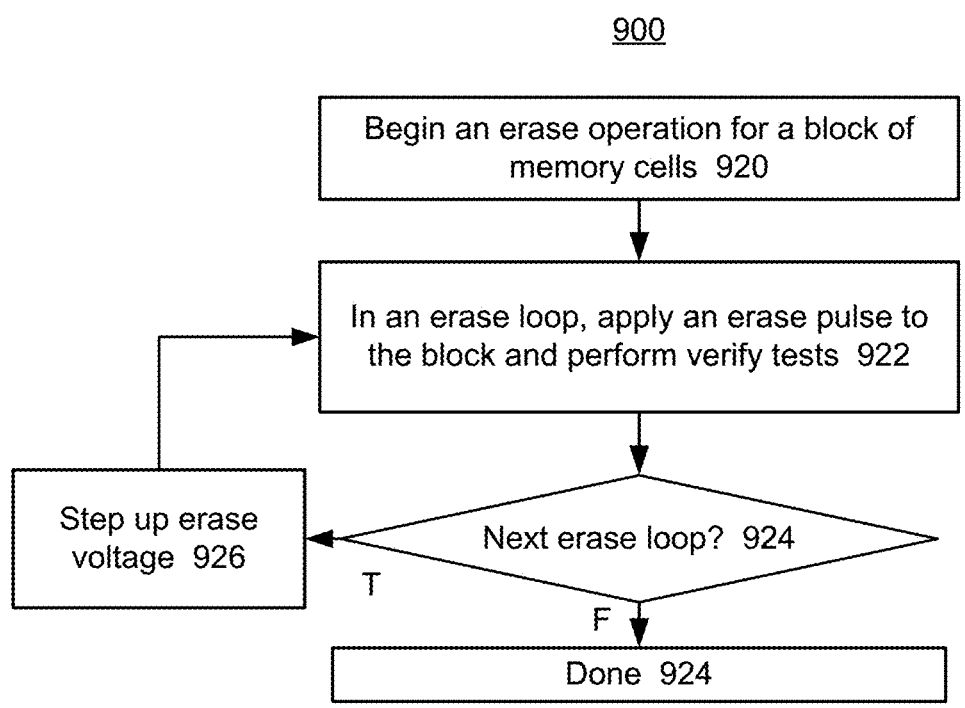
FIG. 9 depicts a flowchart of an embodiment of a process of erasing non-volatile memory cells.

FIG. 9 depicts a flowchart of an embodiment of a process 900 of erasing non-volatile memory cells. The process is performed on an erase block. In an embodiment, the erase block is designated as a hybrid SLC block. The process 900 may also be performed on an erase block that is designated as an SLC block or as an MLC block. Step 920 begins an erase operation for an erase block of memory cells. Step 922 includes, in an erase loop, applying an erase pulse to the erase block, and performing associated verify tests. In an embodiment, the verify tests includes applying an erase verify voltage to word lines (or control gates of memory cells of a NAND string). In some embodiments, the erase block contains whole NAND strings. If all of the memory cells on a NAND string have a Vt below the erase verify voltage then the NAND string will conduct a significant current. If at least one memory cell on the NAND string has a Vt above the erase verify voltage then the NAND string will not conduct a significant current. In some embodiments, the erase block contains partial NAND strings. For example, the erase block can be an upper tier or a lower tier of a 3D NAND structure. As discussed above, the magnitude of the erase verify voltage may depend on whether the memory cells are being erased to an SLC erased state or an MLC erased state.

A decision step 924 determines whether a next erase loop is needed in the erase operation. When the decision step is true, e.g., when erasing is not yet completed for all or nearly all of the memory cells, step 926 steps up the erase voltage and step 922 follows for a further erase loop. When the decision step 924 is false, the erase operation is done at step 924.

Figure 10:
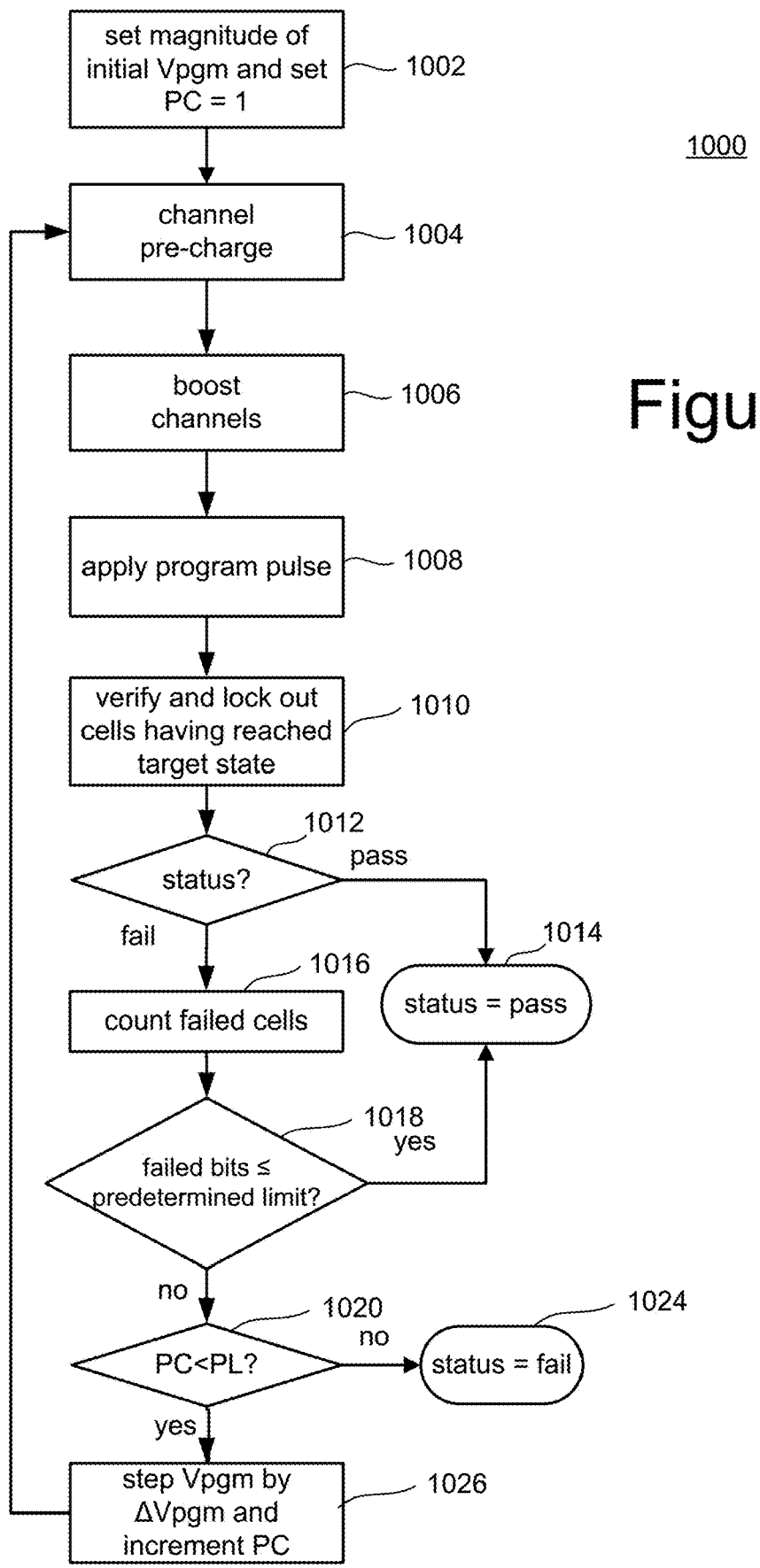
FIG. 10 is a flow chart describing one embodiment of a process for programming non-volatile memory.

FIG. 10 is a flowchart describing one embodiment of a process for programming memory cells. For purposes of this document, the term program and programming are synonymous with write and writing. The programming process is typically performed on one region of the group (e.g., erase block) that was erased. For example, memory cells connected to one word line may be programmed in parallel. The programming process may proceed region by region until the group (e.g., erase block) is fully programmed, which may be referred to as a closed block. No more programming is permitted on a closed block until the block is again erased.

In one example embodiment, the process of FIG. 10 is performed for memory structure 202 using the one or more control circuits (e.g., system control logic 260, column control circuitry 210, row control circuitry 220) discussed above. In one example embodiment, the process of FIG. 10 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 10 is performed to implement the full sequence programming, as well as other programming schemes including multi-stage programming. When implementing multi-stage programming, the process of FIG. 10 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 1002 of FIG. 10, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1004 the control die will pre-charge channels of NAND strings that include memory cells connected to the selected word line that are to be inhibited from programming. In step 1006, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1008, a program voltage pulse of the programming voltage signal Vpgm is applied to the selected word line (the word line selected for programming). If a memory cell on a NAND string should be programmed, then the corresponding bit line is biased at a program enable voltage. In step 1008, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1010, program verify is performed and memory cells that have reached their target states are locked out from further programming by the control die. Step 1010 may also include determining whether a memory cell should receive slow programming during the next program loop, as opposed to full programming. Step 1010 includes performing verification of programming by sensing at one or more verify reference levels. In one embodiment, the verification process is performed by testing whether the threshold voltages of the memory cells selected for programming have reached the appropriate verify reference voltage. In step 1010, a memory cell may be locked out after the memory cell has been verified (by a test of the Vt) that the memory cell has reached its target state. For example, a memory cell may be locked out if it reaches a verify voltage.

If, in step 1012, it is determined that all of the memory cells have reached their target threshold voltages (pass), the programming process is complete and successful because all selected memory cells were programmed and verified to their target states. A status of "PASS" is reported in step 1014. Otherwise if, in step 1012, it is determined that not all of the memory cells have reached their target threshold voltages (fail), then the programming process continues to step 1016.

In step 1016, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 1018, it is determined whether the count from step 1016 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1014. In this situation, enough memory cells programmed correctly such that the few remaining memory cells that have not been completely programmed can be corrected using ECC during the read process. In some embodiments, the predetermined limit used in step 1018 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1020 and the program counter PC is checked against the program limit value (PL). Examples of program limit values include 10, 12, 16, 19, 20 and 30; however, other values can be used. If the program counter PC is not less than the program limit value PL, then the program process is considered to have failed and a status of FAIL is reported in step 1024. If the program counter PC is less than the program limit value PL, then the process continues at step 1026 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 1026, the process loops back to step 1004 and another program pulse is applied to the selected word line (by the control die) so that another iteration (steps 1004-626) of the programming process of FIG. 10 is performed.

Figure 11:
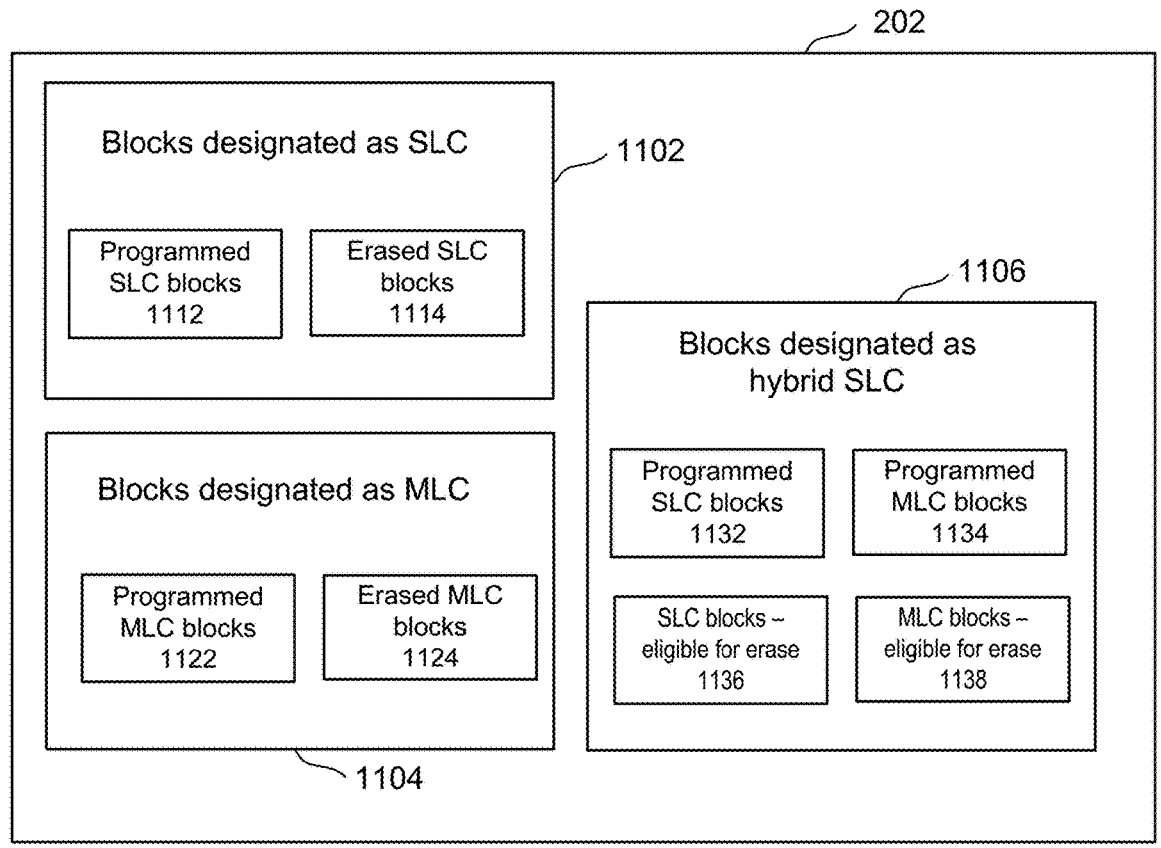
FIG. 11 depicts an embodiment how erase blocks in memory structure may be designated for use.

FIG. 11 depicts an embodiment how erase blocks in memory structure 202 may be designated for use. In an embodiment, the memory controller 120 maintains a list of erase blocks that are designated as SLC blocks 1102, a list of erase blocks that are designated as MLC blocks 1104, and a list of erase blocks that are designated as hybrid SLC blocks 1106. This list may be maintained in local memory 140 during runtime. A copy of the lists may be stored in the memory structure 202.

In general, at a given point in time an SLC block may be an the SLC erased state 1114 (see FIG. 6B), the SLC programmed state 1112 (see FIG. 6A), or have part of the erase block in the SLC erased state and another part of the erase block in the SLC programmed state. An SLC block having all regions in the erased state may be referred to as a free SLC block. An SLC block having all regions in the programmed state may be referred to as a closed SLC block. An SLC block having at least one region in the SLC erased state and at least one region in the SLC programmed state may be referred to as an open SLC block. An open SLC block is eligible to have more SLC data programmed therein.

FIG. 11 depicts erased MLC blocks 1124 and programmed MLC blocks 1122. In some embodiments, at some point after closing multiple SLC blocks, the data from the multiple SLC blocks will be copied to one erased MLC block, which is referred to as a folding operation. However, the folding operation is typically performed in the background while the memory system is idle (not reading or programming used data). Therefore, it is possible that all or most of the SLC blocks could be closed at a given point in time, even if there are a large number of MLC blocks free (erased). After the folding operation, the SLC block is eligible to be erased. In some cases, the data in a programmed MLC block will become stale in which case it is eligible to be erased. For example, if all of the valid data in a programmed MLC block is copied to another MLC block, the programmed MLC is eligible to be erased. The blocks designated as MLC 1104 may be sub-divided into those designated for two-bit per cell storage, those designated for three-bit per cell storage, those designated for four-bit per cell storage, or other sub-divisions.

In FIG. 11, the erase blocks designated as hybrid SLC 1106 are depicted as including those presently programmed as SLC blocks 1132 and those presently programmed as MLC blocks 1134. Some of the hybrid SLC 1106 that are presently programmed in the SLC mode may be designated as eligible for erase 1136. Likewise, some of the hybrid SLC 1106 that are presently programmed in the MLC mode may be designated as eligible for erase 1138. In FIG. 11, none of the erase blocks designated as hybrid SLC 1106 are depicted as presently erased. In some embodiments, the erase blocks designated as hybrid SLC 1106 are not erased until it is determined what state (e.g., SLC, MLC) they will be programmed to next.

Figure 12:
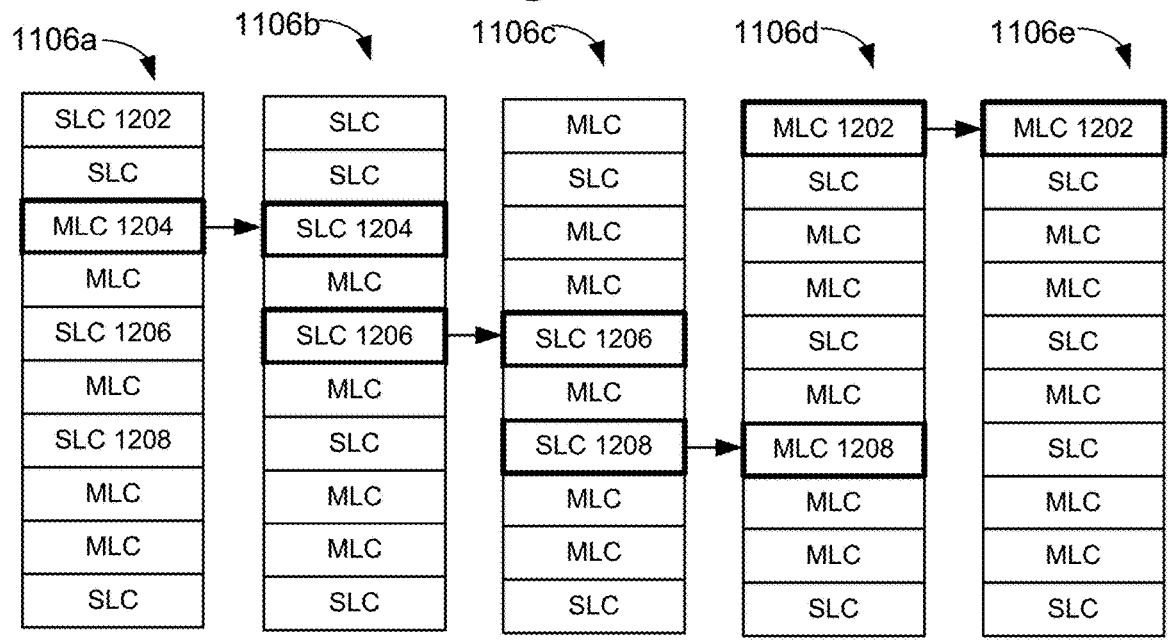
FIG. 12 depicts an example of how the erase blocks designated as hybrid SLC can change between the SLC mode and the MLC mode, as well as to stay in either the SLC mode or the MLC mode.

FIG. 12 depicts an example of how the usage of the erase blocks designated as hybrid SLC blocks 1106 can change between the SLC mode and the MLC mode, as well as to stay in either the SLC mode or the MLC mode. Ten example hybrid SLC blocks are represented in five different usage configurations 1106a-1106e. In usage configuration 1106a five hybrid SLC blocks are presently programed to the SLC mode and five hybrid SLC blocks are presently programed to the MLC mode. For the sake of discussion all of the ten hybrid SLC blocks are eligible for erase. Thus, all are candidates are presently programmed to either the SLC mode or the MLC mode.

The memory system selects hybrid SLC block 1204 for programming to the SLC mode. In usage configuration 1106a, hybrid SLC block 1204 is in the MLC mode. The memory system erases hybrid SLC block 1204 from the MLC programmed data states to the SLC erased state. Recall that in an embodiment, the median SLC erased Vt is greater than the median MLC erased Vt (see FIG. 8). Therefore, erasing the hybrid SLC block 1204 from the MLC programmed data states to the SLC erased state will result is less of a Vt shift compared to if erase had been to the MLC erased Vt distribution. Therefore, the hybrid SLC block 1204 suffers less erase wear. Then, the memory system programs hybrid SLC block 1204 from the SLC erased state to the programmed SLC data state. Similarly, programming the hybrid SLC block 1204 from the SLC erased state to the SLC programmed state will result is less of a Vt shift compared to if programming had been from the MLC erased Vt distribution. Therefore, the hybrid SLC block 1204 suffers less program wear.

The memory system selects hybrid SLC block 1206 for programming to the SLC mode. In usage configuration 1106b, hybrid SLC block 1206 is presently programmed in the SLC mode. The memory system erases hybrid SLC block 1206 from the SLC programmed data state to the SLC erased state. Recall that the SLC erase verify level (e.g., Ver_SLC in FIG. 8) may be higher than at least one of the read reference voltages of the MLC mode. For example, Ver_SLC is greater than Vr1. Some conventional techniques will erase a hybrid SLC block to the MLC erased state such that it will be eligible to be programmed to the MLC programmed states. However, because the decision is made to program the hybrid SLC block to the SLC mode while the hybrid SLC block is still programmed to the SLC mode, it can be erased to the SLC erase Vt distribution. Erasing the hybrid SLC block 1206 from the SLC programmed Vt distribution to the SLC erase Vt distribution results in less of a Vt shift compared to erasing to the MLC erase Vt distribution. Therefore, less erase wear is incurred. Also, programming the hybrid SLC block 1206 from the SLC erase Vt distribution to the SLC programmed Vt distribution will result is less of a Vt shift compared to if programming had been from the MLC erased Vt distribution. Therefore, the hybrid SLC block 1206 suffers less wear from programming.

The memory system selects hybrid SLC block 1208 for programming to the MLC mode. In usage configuration 1106c, hybrid SLC block 1208 is presently programmed in the SLC mode. The memory system erases hybrid SLC block 1208 from the SLC programmed data state to the MLC erased state. Then, the memory system programs the hybrid SLC block 1208 from the MLC erased state to the MLC programmed states.

The memory system selects hybrid SLC block 1202 for programming to the MLC mode. In usage configuration 1106d, hybrid SLC block 1202 is presently programmed in the MLC mode. The memory system erases hybrid SLC block 1202 from the MLC programmed data states to the MLC erased state. Then, the memory system programs the hybrid SLC block 1202 from the MLC erased state to the MLC programmed states.

Figure 13:
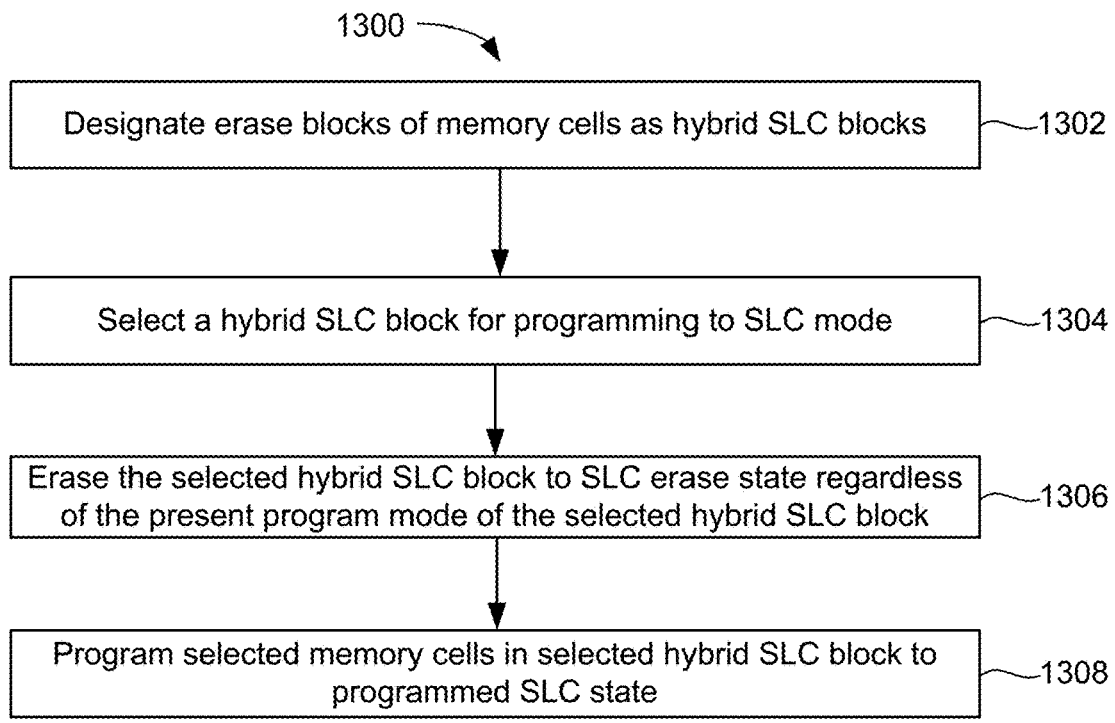
FIG. 13 is a flowchart of one embodiment of a process of operating a memory system having erase blocks of memory cells designated as hybrid SLC blocks.

FIG. 13 is a flowchart of one embodiment of a process 1300 of operating a memory system having erase blocks of memory cells designated as hybrid SLC blocks. In one embodiment, the erase blocks contain NAND strings (2D or 3D).

Step 1302 includes the memory controller 120 designating erase blocks of memory cells as hybrid SLC blocks. The erase blocks are groups of memory cells that are erased as a unit. Over time the memory controller 120 may program some of the hybrid SLC blocks to the SLC mode and other to the MLC mode. Some of these erase blocks may later become eligible to be erased. For example, the SLC data from multiple hybrid SLC blocks programmed to the SLC mode may be folded to one MLC block. The MLC data in a hybrid SLC block programmed to the MLC mode may become stale, wherein the hybrid SLC block is eligible to be erased. In one embodiment, the hybrid SLC blocks are eligible for the SLC mode and a two-bits per cell MLC mode. In one embodiment, the hybrid SLC blocks are eligible for the SLC mode and a three-bits per cell MLC mode. In one embodiment, the hybrid SLC blocks are eligible for the SLC mode and a four-bits per cell MLC mode. In one embodiment, the hybrid SLC blocks are eligible for the SLC mode and a more than one MLC mode (e.g., two-bits per cell, three-bits per cell, and/or four bits per cell).

Step 1304 includes selecting a hybrid SLC block for programming to the SLC mode. The hybrid SLC block is selected from among a number of candidate hybrid SLC blocks that are presently programmed to either the SLC mode or the MLC mode. Although the candidate hybrid SLC blocks are presently programmed they are each eligible to be erased. Further details of one embodiment of selecting a hybrid SLC block for erase are discussed in connection with FIG. 14.

Step 1306 includes erasing the selected hybrid SLC block to the SLC erased state regardless of the present program mode of the selected hybrid SLC group. In an embodiment, the median Vt of the SLC erase Vt distribution is greater than the median Vt of the MLC erase Vt distribution. Step 1306 includes an erase verify step that applies an SLC erase verify voltage (e.g., Ver_SLC) to the memory cells. In an embodiment, the SLC erase verify voltage is greater than the MLC erase verify voltage. In an embodiment, the SLC erase verify voltage is greater than at least one read reference voltage of the MLC mode. In an embodiment, the SLC erase verify voltage is greater than at least one program verify voltage of the MLC mode.

Step 1308 includes programming selected memory cells in the selected hybrid SLC block from the SLC erased state to the SLC programmed state. In an embodiment, approximately half of the memory cells are programmed to the SLC programmed state.

Figure 14:
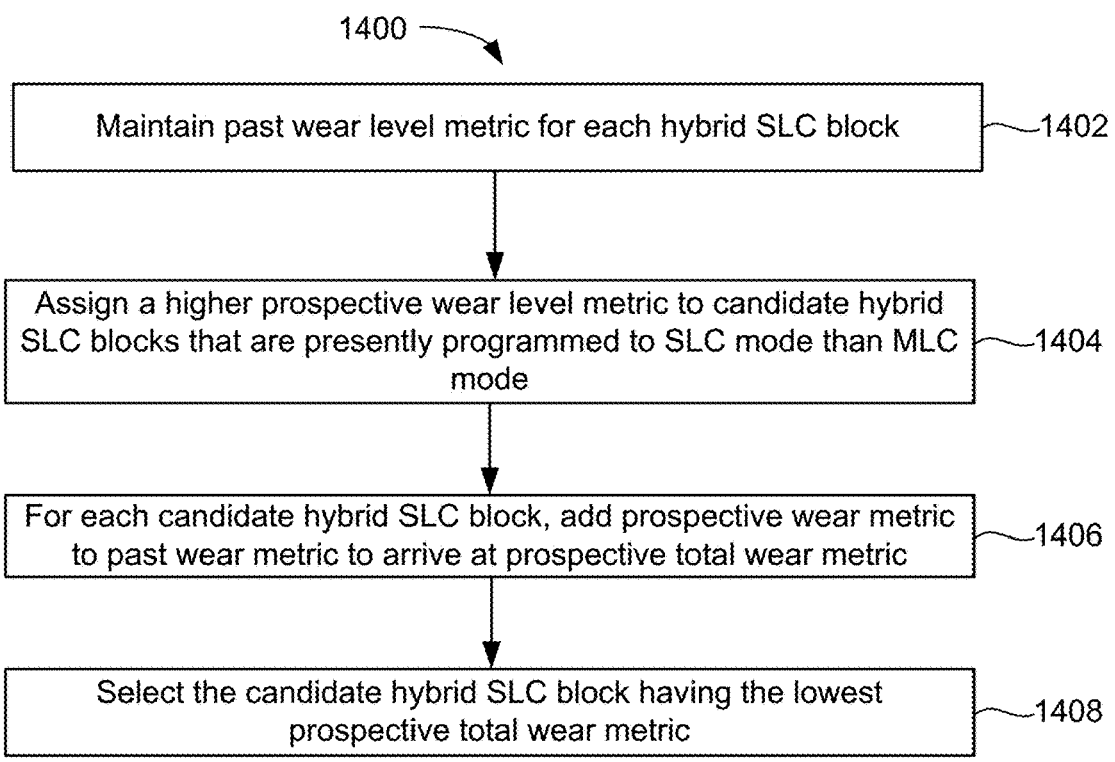
FIG. 14 is a flowchart of one embodiment of a process of selecting a hybrid SLC block for erase and program.

FIG. 14 is a flowchart of one embodiment of a process 1400 of selecting a hybrid SLC block for erase and program. Process 1400 may be used in an embodiment of step 1304 of process 1300. However, process 1400 may also be performed independent of process 1300. The process 1400 may be used for selecting a hybrid SLC block for programming to either the SLC mode or the MLC mode.

Step 1402 includes the memory controller 120 maintaining a past wear level metric for each hybrid SLC block. The past wear level metric is based on actual program/erase cycles. In one embodiment, the past wear level metric is incremented each time that the hybrid SLC block is erased and each time that the hybrid SLC block is programmed. In one embodiment, the past wear level metric is incremented once for each program/erase cycle. The past wear level metric may be based on the average (e.g., median, mean) Vt swing that the memory cells experience from being erased for a given cycle, as well as the average (e.g., median, mean) Vt swing that the memory cells experience from programming for a given cycle.

In step 1404 the memory controller 120 assigns a prospective wear metric to each candidate hybrid SLC block. The candidate hybrid SLC blocks are those that are presently eligible for erase. A candidate hybrid SLC block could presently be programmed to the SLC mode or the MLC mode. A prospective wear metric is based on how much wear that the candidate hybrid SLC block would experience if erased and programmed if the block is selected. The prospective wear metric may be based on the average Vt swing that the memory cells would experience from being erased from their respective present programmed state, as well as the average Vt swing that the memory cells would experience from programming if selected in process 1400.

In step 1406, for each candidate hybrid SLC block, the prospective wear metric is added to the past wear metric to arrive at a prospective total wear metric for each candidate hybrid SLC block.

In step 1408, the candidate hybrid SLC block with the lowest prospective total wear metric is selected for erase and program. Then, the erase process in FIG. 9 may be used to erase the selected hybrid SLC block. The selected hybrid SLC block may be erased as a unit. Next, the program process in FIG. 10 may be used to program the selected hybrid SLC block. The selected hybrid SLC block may be programmed one region at a time until all regions are programmed. After erasing and programming the selected hybrid SLC block, the past wear metric may be changed to the prospective total wear metric. In other words, the past wear metric may be incremented by the prospective wear metric that was assigned in step 1404.

Figure 15:
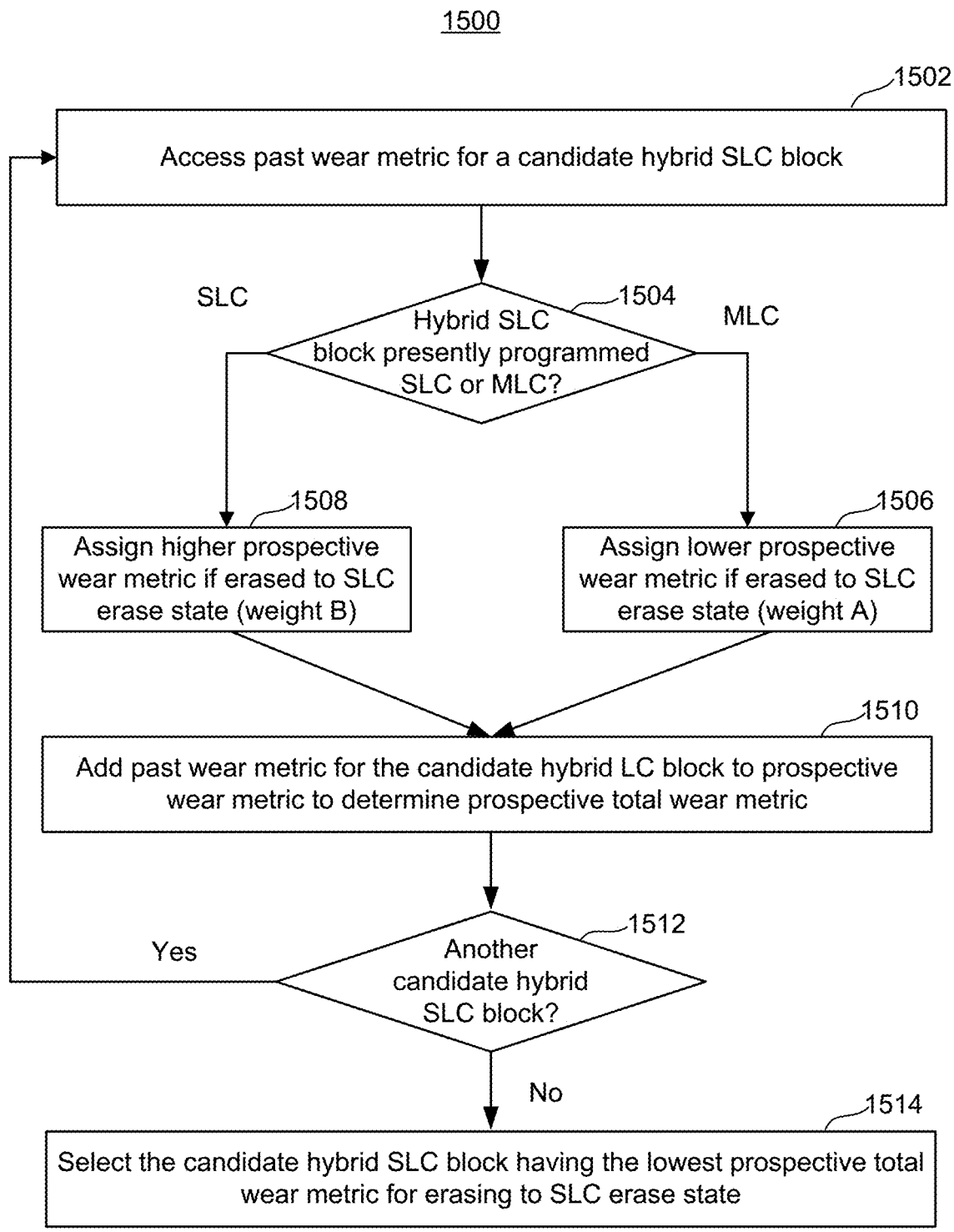
FIG. 15 is a flowchart of one embodiment of a process of selecting a hybrid SLC block for erase to the SLC erased state and programming to the SLC programmed state.

FIG. 15 is a flowchart of one embodiment of a process 1500 of selecting a hybrid SLC block for erase to the SLC erased state and programming to the SLC programmed state. Process 1500 may be used in an embodiment of step 1304 of process 1300. However, process 1500 may also be performed independent of process 1300. The process 1500 may be used for steps 1404-1408 in FIG. 14.

Step 1502 includes accessing a past wear metric for a candidate hybrid SLC block. Step 1504 includes a determination of whether the candidate hybrid SLC block is presently programmed to the SLC mode or the MLC mode. The memory controller 120 will assign a prospective wear metric that is based on which mode the hybrid SLC block is presently programmed to. The prospective wear metric is based on an assumption that the hybrid SLC block will be erased to the SLC erased state. If the candidate hybrid SLC block is presently programmed to the MLC mode, then in step 1506, the memory controller 120 assigns a lower prospective wear metric (weight A). If the candidate hybrid SLC block is presently programmed to the SLC mode, then in step 1508, the memory controller 120 assigns a higher prospective wear metric (weight B). Thus, weight B has a higher value (i.e., greater prospective wear) than weight A. Here, "lower" means that weight A is lower than weight B. Likewise, "higher" means that weight B is higher than weight A.

In an embodiment, weight A and weight B are based on an average Vt swing that memory cells in the candidate SLC block would experience if erased to the SLC erased state and programmed to the SLC programmed state. An example of the calculation for weight A may be based on the Vt swing between the median MLC programmed Vt (see FIG. 7A, for example) to the median SLC erased Vt (see FIG. 6B or 8, for example). In one embodiment, this erase Vt swing is about 3.25V. Weight A may further be based on the Vt swing between the median SLC erased V and the median SLC programmed Vt (see FIG. 6A, for example). In one embodiment, this program Vt swing is about 4.25V.

An example of the calculation for weight B may be based on the Vt swing between the median SLC programmed Vt (see FIG. 6A, for example) to the median SLC erased Vt (see FIG. 6B or 8, for example). In one embodiment, this erase Vt swing is about 4.25V. Weight B may further be based on the Vt swing between the median SLC erased V and the median SLC programmed Vt (see FIG. 6A, for example). In one embodiment, this program Vt swing is about 4.25V.

In step 1510, the memory controller 120 adds the past wear metric to the prospective wear metric to determine a prospective total wear metric. Step 1512 is a determination of whether there is another candidate hybrid SLC block to consider. If so, steps 1502-1510 are performed for the next candidate hybrid SLC block. After a prospective total wear metric is determined for all candidate hybrid SLC blocks, the memory controller 120 selects the candidate having the lowest prospective total wear metric (step 1514) for erasing to the SLC erased state and programming to the SLC programmed state.

Figure 16:
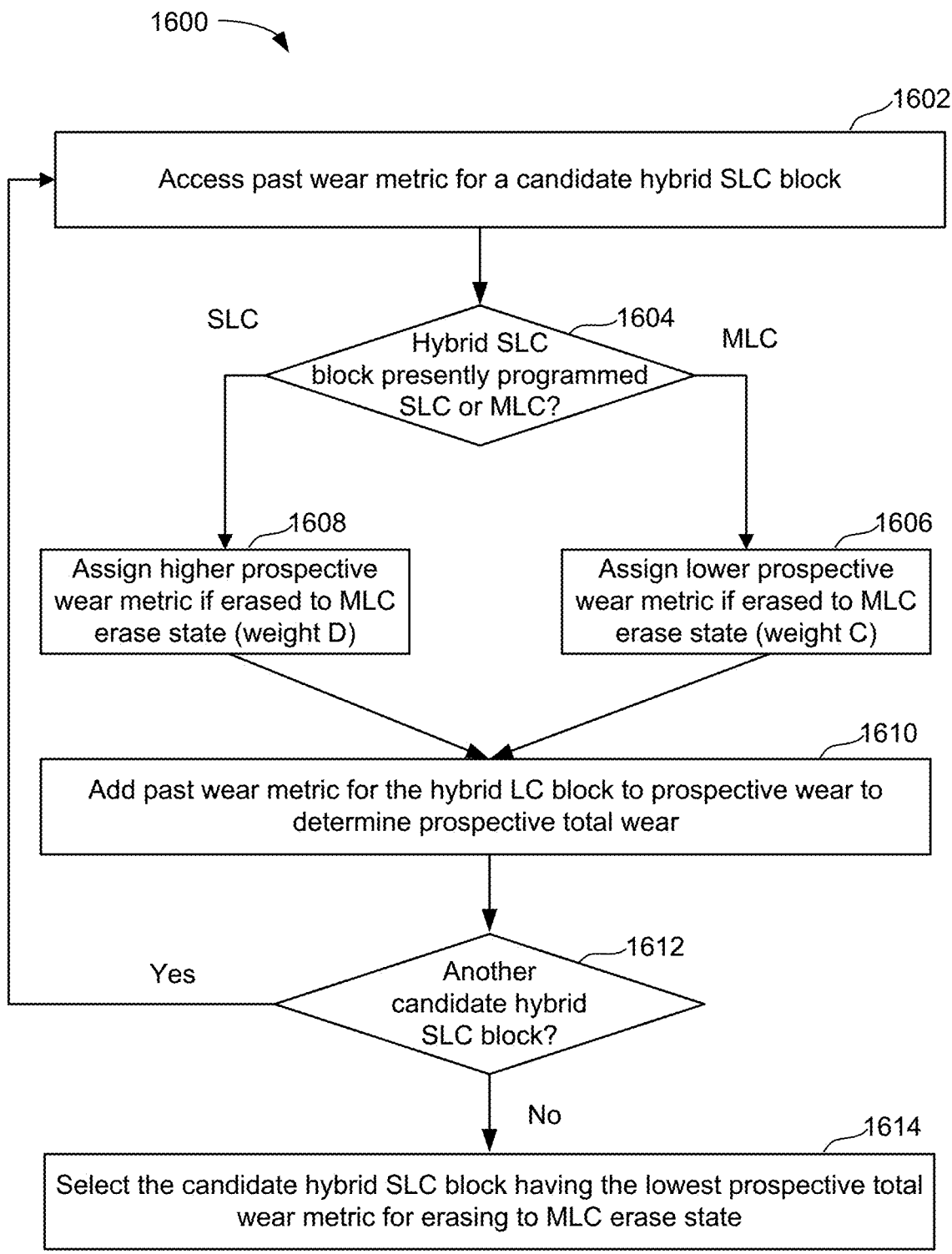
FIG. 16 is a flowchart of one embodiment of a process of selecting a hybrid SLC block for erase to the MLC erased state and programming to the MLC programmed state.

FIG. 16 is a flowchart of one embodiment of a process 1600 of selecting a hybrid SLC block for erase to the MLC erased state and programming to the MLC programmed state. The process 1600 may be used for steps 1404-1408 in FIG. 14.

Step 1602 includes accessing a past wear metric for a candidate hybrid SLC block. Step 1604 includes a determination of whether the candidate hybrid SLC block is presently programmed to the SLC mode or the MLC mode. The memory controller 120 will assign a prospective wear metric that is based on which mode the hybrid SLC block is presently programmed to. The prospective wear metric is based on an assumption that the hybrid SLC block will be erased to the MLC erased state. If the candidate hybrid SLC block is presently programmed to the MLC mode, then in step 1606, the memory controller 120 assigns a lower prospective wear metric (weight C). If the candidate hybrid SLC block is presently programmed to the SLC mode, then in step 1608, the memory controller 120 assigns a higher prospective wear metric (weight D). Thus, weight D has a higher value (i.e., greater prospective wear) than weight C. Here, "lower" means that weight C is lower than weight D. Likewise, "higher" means that weight D is higher than weight C.

In an embodiment, weight C and weight D are based on an average Vt swing that memory cells in the candidate SLC block would experience if erased to the MLC erased state and programmed to the MLC programmed state. An example of the calculation for weight C may be based on the Vt swing between the median MLC programmed Vt (see FIG. 7A, for example) to the median MLC erased Vt (see FIG. 7B or 8, for example). In one embodiment, this erase Vt swing is about 4.75V. Weight C may further be based on the Vt swing between the median MLC erased V and the median MLC programmed Vt (see FIG. 7A, for example). In one embodiment, this program Vt swing is about 4.75V.

An example of the calculation for weight D may be based on the Vt swing between the median SLC programmed Vt (see FIG. 6A, for example) to the median MLC erased Vt (see FIG. 7B or 8, for example). In one embodiment, this erase Vt swing is about 5.75V. Weight D may further be based on the Vt swing between the median MLC erased Vt and the median MLC programmed Vt (see FIG. 7A, for example). In one embodiment, this program Vt swing is about 4.75V.

In step 1610, the memory controller 120 adds the past wear metric to the prospective wear metric to determine a prospective total wear metric. Step 1612 is a determination of whether there is another candidate hybrid SLC block to consider. If so, steps 1602-1610 are performed for the next candidate hybrid SLC block. After a prospective total wear metric is determined for all candidate hybrid SLC blocks, the memory controller 120 selects the candidate having the lowest prospective total wear metric (step 1614) for erasing to the MLC erased state and programming to the MLC programmed states.

In view of the foregoing, it can be seen that one embodiment includes an apparatus, comprising one or more control circuits configured to connect to a memory structure comprising non-volatile memory cells. The one or more control circuits configured to designate a plurality of groups of the non-volatile memory cells as hybrid SLC groups. Each hybrid SLC group is eligible to be programmed to different program modes that include a single bit per memory cell (SLC) mode and a multiple bits per memory cell (MLC) mode. The one or more control circuits are configured to select a hybrid SLC group for programming to the SLC mode while the selected hybrid SLC group is presently programmed to one of the different program modes. In other words, the selected hybrid SLC group is presently programmed to either the SLC mode or the MLC mode. The one or more control circuits are configured to erase memory cells in the selected hybrid SLC group to an erased state associated with the SLC mode regardless of the present program mode of the selected hybrid SLC group. An average memory cell threshold voltage of the erased state associated with the SLC mode is greater than an average threshold voltage of an erased state associated with the MLC mode. The one or more control circuits are configured to program selected memory cells in the selected hybrid SLC group from the erased state associated with the SLC mode to a programmed state associated with the SLC mode.

In a second embodiment, in furtherance of the first embodiment, an erase verify reference voltage for the erased state associated with the SLC mode is greater than at least one program verify reference voltage associated with the MLC mode.

In a third embodiment, in furtherance of the first or second embodiments, the one or more control circuits are further configured to select another of the hybrid SLC groups for programming to a selected program mode while the other selected hybrid SLC group is presently programmed to one of the different program modes. The selection of the other group is based on a past wear metric of respective candidate hybrid SLC groups and a prospective wear metric that is based on an average threshold voltage swing that memory cells in the candidate hybrid SLC group will experience due to erasing the candidate hybrid SLC group to an erased state associated with the selected mode.

In a fourth embodiment, in furtherance of any of the first to third embodiments, the one or more control circuits are further configured to select the hybrid SLC group for programming to the SLC mode based on a past wear metric of respective candidate hybrid SLC groups and a prospective wear metric that is based on an average threshold voltage swing that memory cells in the candidate hybrid SLC group will experience due to erasing the candidate hybrid SLC group to the erased state associated with the SLC mode.

In a fifth embodiment, in furtherance of any of the fourth embodiment, the one or more control circuits are further configured to assign a first prospective wear metric to a first candidate hybrid SLC group that would be erased from MLC programmed threshold voltage distributions to an SLC erase threshold voltage distribution if selected for programming to the SLC mode. The one or more control circuits are further configured to assign a second prospective wear metric to a second candidate hybrid SLC group that would be erased from the SLC programmed threshold voltage distribution to the SLC erase threshold voltage distribution if selected for programming to the SLC mode, wherein the second prospective wear metric is greater than the first prospective wear metric.

In a sixth embodiment, in furtherance of any of the first to fifth embodiments, the one or more control circuits are further configured to select another of the hybrid SLC groups for programming to the MLC mode while the other selected hybrid SLC group is presently programmed to one of the different program modes. The selection of the other group is based on a past wear metric of respective candidate hybrid SLC groups and a prospective wear metric that is based on an average threshold voltage swing that memory cells in the candidate hybrid SLC group will experience due to erasing the candidate hybrid SLC group to the erased state associated with the MLC mode.

In a seventh embodiment, in furtherance of any of the sixth embodiment, the one or more control circuits are further configured to assign a first prospective wear metric to a first candidate hybrid SLC group that would be erased from an SLC programmed threshold voltage distribution to an MLC erase threshold voltage distribution if selected for programming to the MLC mode. The one or more control circuits are further configured to assign a second prospective wear metric to a second candidate hybrid SLC group that would be erased from the MLC programmed threshold voltage distributions to an MLC erase threshold voltage distribution if selected for programming to the MLC mode, wherein the second prospective wear metric is less than the first prospective wear metric.

In an eighth embodiment, in furtherance of any of the first to seventh embodiments, approximately half of the memory cells in the selected hybrid SLC group are programmed to the programmed state associated the SLC mode immediately prior to erasing the selected hybrid SLC group to the erased state associated with the SLC mode.

In a ninth embodiment, in furtherance of any of the first to seventh embodiments, a majority of the memory cells in the selected hybrid SLC group are programmed to a programmed state in the MLC mode immediately prior to erasing the selected hybrid SLC group to the erased state associated with the SLC mode.

One embodiment includes a method wear-leveling in non-volatile storage. The method comprises maintaining a past wear metric for each hybrid SLC block of non-volatile memory cells in a memory structure. Each hybrid SLC block is designated for use as either programming to a single bit per cell (SLC) mode or programming to a multiple bits per cell (MLC) mode. The past wear metric is based on actual program/erase cycles. The method comprises assigning a higher prospective wear metric to candidate hybrid SLC blocks that are presently programmed to SLC threshold voltage distributions than candidate hybrid SLC blocks presently programmed to MLC threshold voltage distributions. The method comprises adding the prospective wear metric to the past wear metric for each candidate hybrid SLC block to determine a prospective total wear metric for each candidate hybrid SLC block. The method comprises selecting the candidate hybrid SLC block having the lowest prospective total wear metric for erasing and programming.

One embodiment includes a non-volatile storage system, comprising a memory structure comprising non-volatile memory cells. The memory cells are arranged in erase blocks. The non-volatile storage system comprises means for designating a plurality of the erase blocks as hybrid SLC blocks. Each hybrid SLC block is eligible to be programmed to either a single bit per memory cell (SLC) mode or multiple bits per memory cell (MLC) mode. The non-volatile storage system comprises means for selecting a hybrid SLC block for programming to the SLC mode while the selected hybrid SLC block is presently programmed to either the SLC mode or the MLC mode. The non-volatile storage system comprises means for erasing memory cells in the selected hybrid SLC block to an erased state associated with the SLC mode regardless of the present program mode of the selected hybrid SLC block. An erase verify reference voltage for the erased state associated with the SLC mode is greater than an erase verify reference voltage for an erased state associated with the MLC mode. The non-volatile storage system comprises means for programming selected memory cells in the selected hybrid SLC block from the erased state associated with the SLC mode to a programmed state associated with the SLC mode.

In an embodiment, means for designating a plurality of the erase blocks as hybrid SLC blocks comprises one or more of memory controller 120, processor 156, local memory 140, and/or system control logic 260. In an embodiment, means for designating a plurality of the erase blocks as hybrid SLC blocks comprises one or more of a processor, FPGA, ASIC, integrated circuit, or other type of circuit.

In an embodiment, means for selecting a hybrid SLC block for programming to the SLC mode while the selected hybrid SLC block is presently programmed to either the SLC mode or the MLC mode comprises one or more of memory controller 120, processor 156, and/or system control logic 260. In an embodiment, means for selecting a hybrid SLC block for programming to the SLC mode while the selected hybrid SLC block is presently programmed to either the SLC mode or the MLC mode comprises one or more of a processor, FPGA, ASIC, integrated circuit, or other type of circuit. In an embodiment, means for selecting a hybrid SLC block for programming to the SLC mode while the selected hybrid SLC block is presently programmed to either the SLC mode or the MLC mode performs process 1400 in FIG. 14.

In an embodiment, means for erasing memory cells in the selected hybrid SLC block to an erased state associated with the SLC mode regardless of the present program mode of the selected hybrid SLC block comprises one or more of memory controller 120, processor 156, system control logic 260, column control circuitry 210, and/or row control circuitry 220. In an embodiment, means for erasing memory cells in the selected hybrid SLC block to an erased state associated with the SLC mode regardless of the present program mode of the selected hybrid SLC block comprises one or more of a processor, FPGA, ASIC, integrated circuit, or other type of circuit. In an embodiment, means for erasing memory cells in the selected hybrid SLC block to an erased state associated with the SLC mode regardless of the present program mode of the selected hybrid SLC block performs process 900 in FIG. 9.

In an embodiment, means for programming selected memory cells in the selected hybrid SLC block from the erased state associated with the SLC mode to a programmed state associated with the SLC mode comprises one or more of memory controller 120, processor 156, system control logic 260, column control circuitry 210, and/or row control circuitry 220. In an embodiment, means for programming selected memory cells in the selected hybrid SLC block from the erased state associated with the SLC mode to a programmed state associated with the SLC mode comprises one or more of a processor, FPGA, ASIC, integrated circuit, or other type of circuit. In an embodiment, means for programming selected memory cells in the selected hybrid SLC block from the erased state associated with the SLC mode to a programmed state associated with the SLC mode performs process 1000 in FIG. 10.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a memory structure comprising non-volatile memory cells, the one or more control circuits configured to:
   designate a plurality of groups of the non-volatile memory cells as hybrid SLC groups, wherein each hybrid SLC group is eligible to be programmed to different program modes that include a single bit per memory cell (SLC) mode and a multiple bits per memory cell (MLC) mode;

select a hybrid SLC group for programming to the SLC mode while the selected hybrid SLC group is presently programmed to one of the different program modes;

erase memory cells in the selected hybrid SLC group to an erased state associated with the SLC mode regardless of the present program mode of the selected hybrid SLC group, wherein an average memory cell threshold voltage of the erased state associated with the SLC mode is greater than an average threshold voltage of an erased state associated with the MLC mode; and program selected memory cells in the selected hybrid SLC group from the erased state associated with the SLC mode to a programmed state associated with the SLC mode.

2. The apparatus of claim 1, wherein an erase verify reference voltage for the erased state associated with the SLC mode is greater than at least one program verify reference voltage associated with the MLC mode.

3. The apparatus of claim 1, wherein the one or more control circuits are further configured to:

select another of the hybrid SLC groups for programming to a selected program mode while the other selected hybrid SLC group is presently programmed to one of the different program modes, the selection of the other group based on a past wear metric of respective candidate hybrid SLC groups and a prospective wear metric that is based on an average threshold voltage swing that memory cells in the candidate hybrid SLC group will experience due to erasing the candidate hybrid SLC group to an erased state associated with the selected mode.

4. The apparatus of claim 1, wherein the one or more control circuits are further configured to:

select the hybrid SLC group for programming to the SLC mode based on a past wear metric of respective candidate hybrid SLC groups and a prospective wear metric that is based on an average threshold voltage swing that memory cells in the candidate hybrid SLC group will experience due to erasing the candidate hybrid SLC group to the erased state associated with the SLC mode.

5. The apparatus of claim 4, wherein the one or more control circuits are further configured to:

assign a first prospective wear metric to a first candidate hybrid SLC group that would be erased from MLC programmed threshold voltage distributions to an SLC erase threshold voltage distribution if selected for programming to the SLC mode; and assign a second prospective wear metric to a second candidate hybrid SLC group that would be erased from the SLC programmed threshold voltage distribution to the SLC erase threshold voltage distribution if selected for programming to the SLC mode, wherein the second prospective wear metric is greater than the first prospective wear metric.

6. The apparatus of claim 1, wherein the one or more control circuits are further configured to:

select another of the hybrid SLC groups for programming to the MLC mode while the other selected hybrid SLC group is presently programmed to one of the different program modes, the selection of the other group based on a past wear metric of respective candidate hybrid SLC groups and a prospective wear metric that is based on an average threshold voltage swing that memory cells in the candidate hybrid SLC group will experience due to erasing the candidate hybrid SLC group to the erased state associated with the MLC mode.

7. The apparatus of claim 6, wherein the one or more control circuits are further configured to:

assign a first prospective wear metric to a first candidate hybrid SLC group that would be erased from an SLC programmed threshold voltage distribution to an MLC erase threshold voltage distribution if selected for programming to the MLC mode; and assign a second prospective wear metric to a second candidate hybrid SLC group that would be erased from the MLC programmed threshold voltage distributions to an MLC erase threshold voltage distribution if selected for programming to the MLC mode, wherein the second prospective wear metric is less than the first prospective wear metric.

8. The apparatus of claim 1, wherein approximately half of the memory cells in the selected hybrid SLC group are programmed to the programmed state associated the SLC mode immediately prior to erasing the selected hybrid SLC group to the erased state associated with the SLC mode.

9. The apparatus of claim 1, wherein a majority of the memory cells in the selected hybrid SLC group are programmed to a programmed state in the MLC mode immediately prior to erasing the selected hybrid SLC group to the erased state associated with the SLC mode.

10. A method of wear-leveling in non-volatile storage, the method comprising:

maintaining a past wear metric for each hybrid SLC block of non-volatile memory cells in a memory structure, wherein each hybrid SLC block is designated for use as either programming to a single bit per cell (SLC) mode or programming to a multiple bits per cell (MLC) mode, wherein the past wear metric is based on actual program/erase cycles;

assigning a higher prospective wear metric to candidate hybrid SLC blocks that are presently programmed to SLC threshold voltage distributions than candidate hybrid SLC blocks presently programmed to MLC threshold voltage distributions;

adding the prospective wear metric to the past wear metric for each candidate hybrid SLC block to determine a prospective total wear metric for each candidate hybrid SLC block; and selecting the candidate hybrid SLC block having the lowest prospective total wear metric for erasing and programming.

11. The method of claim 10, wherein assigning a higher prospective erase wear to candidate hybrid SLC blocks that are presently programmed to SLC threshold voltage distributions than candidate hybrid SLC blocks presently programmed to MLC threshold voltage distributions comprises:

assigning a first prospective erase wear to a first candidate hybrid SLC block that would be erased from an SLC programmed threshold voltage distribution to an MLC erase threshold voltage distribution if selected; and assigning a second prospective erase wear to a second candidate SLC block that would be erased from MLC programmed threshold voltage distributions to the MLC erase threshold voltage distribution if selected, wherein the second prospective erase wear is less than the first prospective erase wear.

12. The method of claim 10, wherein assigning a higher prospective erase wear to candidate hybrid SLC blocks that are presently programmed to SLC threshold voltage distributions than candidate hybrid SLC blocks presently programmed to MLC threshold voltage distributions comprises:
  assigning a first prospective erase wear to a first candidate SLC block that would be erased from MLC programmed threshold voltage distributions to an SLC erase threshold voltage distribution if selected; and
  assigning a second prospective erase wear to a second candidate SLC block that would be erased from an SLC programmed threshold voltage distribution to the MLC erase threshold voltage distribution if selected, wherein the second prospective erase wear is greater than the first prospective erase wear.

13. The method of claim 10, wherein selecting the candidate hybrid SLC block having the lowest prospective total wear for erasing and programming comprises:
  selecting a first candidate hybrid SLC block over a second candidate hybrid SLC block, wherein the first candidate hybrid SLC block has a higher past wear metric but a lower prospective total wear than the second candidate hybrid SLC block.

14. The method of claim 10, further comprising:
  erasing the selected candidate hybrid SLC block from MLC programmed threshold voltage distributions to an SLC erase threshold voltage distribution, wherein a median voltage of the SLC erase threshold voltage distribution is greater than a median voltage of an MLC erase threshold distribution; and
  programming the selected candidate hybrid SLC block from the SLC erase threshold voltage distribution to an SLC programmed threshold voltage distribution.

15. The method of claim 10, further comprising:
  erasing the selected candidate hybrid SLC block from an SLC programmed threshold voltage distribution to an SLC erase threshold voltage distribution, wherein a median voltage of the SLC erase threshold voltage distribution is greater than a median voltage of an MLC erase threshold distribution; and
  programming the selected candidate hybrid SLC block from the SLC erase threshold voltage distribution to the SLC programmed threshold voltage distribution.

16. A non-volatile storage system, the system comprising:
  a memory structure comprising non-volatile memory cells, wherein the memory cells are arranged in erase blocks;
  means for designating a plurality of the erase blocks as hybrid SLC blocks, wherein each hybrid SLC block is eligible to be programmed to either a single bit per memory cell (SLC) mode or multiple bits per memory cell (MLC) mode;
  means for selecting a hybrid SLC block for programming to the SLC mode while the selected hybrid SLC block is presently programmed to either the SLC mode or the MLC mode;
  means for erasing memory cells in the selected hybrid SLC block to an erased state associated with the SLC mode regardless of the present program mode of the selected hybrid SLC block, wherein an erase verify reference voltage for the erased state associated with the SLC mode is greater than an erase verify reference voltage for an erased state associated with the MLC mode; and
  means for programming selected memory cells in the selected hybrid SLC block from the erased state associated with the SLC mode to a programmed state associated with the SLC mode.

17. The non-volatile storage system of claim 16, wherein an erase verify reference voltage for the erased state associated with the SLC mode is greater than at least one program verify reference voltage associated with the MLC mode.

18. The non-volatile storage system of claim 16, further comprising:
  means for selecting another of the hybrid SLC blocks for programming to a selected mode while the other selected hybrid SLC block is presently programmed to one of the different program modes, the selection of the other hybrid SLC block based on a summation of a past wear metric of respective candidate hybrid SLC block and a prospective wear metric, wherein the prospective wear metric is based on an average threshold voltage swing that memory cells in the candidate hybrid SLC block will experience due to erasing the candidate hybrid SLC block to an erased state associated with the selected mode and programming the candidate hybrid SLC block from the erased state associated with the selected mode to one or more programmed states associated with the selected mode.

19. The non-volatile storage system of claim 16, further comprising:
  means for selecting the hybrid SLC block for programming to the SLC mode based on a summation of a past wear metric of respective candidate hybrid SLC blocks and a prospective wear metric, the prospective wear metric based on an average threshold voltage swing that memory cells in the candidate hybrid SLC block will experience due to erasing the candidate hybrid SLC block to the erased state associated with the SLC mode and an average threshold voltage swing that memory cells in the candidate hybrid SLC block will experience due to programming the candidate hybrid SLC block from the erased state associated with the SLC mode to a programmed state associated with the SLC mode.

20. The non-volatile storage system of claim 16, further comprising:
  means for selecting another of the hybrid SLC blocks for programming to the MLC mode while the other selected hybrid SLC block is presently programmed to one of the different program modes, the selection based on a summation of a past wear metric of respective candidate hybrid SLC blocks and a prospective wear metric, the prospective wear metric based on an average threshold voltage swing that memory cells in the candidate hybrid SLC block will experience due to erasing the candidate hybrid SLC block to the erased state associated with the MLC mode and an average threshold voltage swing that memory cells in the candidate hybrid SLC block will experience due to programming the candidate hybrid SLC block from the erased state associated with the MLC mode to programmed states associated with the MLC mode.

* * * * *